US010609318B2

(12) United States Patent
Sakakibara et al.

(10) Patent No.: US 10,609,318 B2
(45) Date of Patent: Mar. 31, 2020

(54) IMAGING DEVICE, DRIVING METHOD, AND ELECTRONIC APPARATUS

(71) Applicant: SONY CORPORATION, Tokyo (JP)

(72) Inventors: Masaki Sakakibara, Kanagawa (JP); Yorito Sakano, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 59 days.

(21) Appl. No.: 15/522,119

(22) PCT Filed: Oct. 23, 2015

(86) PCT No.: PCT/JP2015/079923
§ 371 (c)(1),
(2) Date: Apr. 26, 2017

(87) PCT Pub. No.: WO2016/072289
PCT Pub. Date: May 12, 2016

(65) Prior Publication Data
US 2017/0318250 A1    Nov. 2, 2017

(30) Foreign Application Priority Data

Nov. 7, 2014    (JP) ................................ 2014-226695

(51) Int. Cl.
*H04N 5/378* (2011.01)
*H04N 5/3745* (2011.01)
(Continued)

(52) U.S. Cl.
CPC ....... *H04N 5/378* (2013.01); *H01L 27/14643* (2013.01); *H04N 5/355* (2013.01);
(Continued)

(58) Field of Classification Search
CPC ...... H04N 5/378; H04N 5/3559; H04N 5/374; H04N 5/3745; H04N 5/355; H01L 27/14643; H01L 27/14612
See application file for complete search history.

(56) References Cited

U.S. PATENT DOCUMENTS 9,185,314 B2 * 11/2015 Mantri ................... H04N 5/359
2010/0188543 A1 * 7/2010 Oike ................. H01L 27/14609
348/308
(Continued)

FOREIGN PATENT DOCUMENTS

JP    2006-032438 A    2/2006
JP    2006-148284 A    6/2006
(Continued)

*Primary Examiner* — Nhan T Tran
(74) *Attorney, Agent, or Firm* — Chip Law Group

(57) ABSTRACT

The present technology relates to an imaging device, a driving method, and an electronic apparatus capable of more quickly acquiring a high-quality image. In a pixel of a solid-state imaging device, a photoelectric conversion unit that performs a photoelectric conversion of incident light is disposed. An electric charge/voltage converting unit converts electric charge acquired by the photoelectric conversion unit into a voltage signal. A signal comparator compares a supplied reference signal with the voltage signal acquired by the electric charge/voltage converting unit and outputs a result of the comparison. A storage unit adaptively changes the conversion efficiency of the electric charge/voltage converting unit on the basis of a control signal acquired on the basis of a result of the comparison output from the signal comparator. The present technology can be applied to a solid-state imaging device.

17 Claims, 14 Drawing Sheets

(51) Int. Cl.
*H04N 5/355* (2011.01)
*H04N 5/374* (2011.01)
*H01L 27/146* (2006.01)

(52) U.S. Cl.
CPC ........... *H04N 5/3559* (2013.01); *H04N 5/374* (2013.01); *H04N 5/3745* (2013.01); *H01L 27/14612* (2013.01)

(56) References Cited

U.S. PATENT DOCUMENTS

2012/0188427 A1\* 7/2012 Solhusvik ............ H04N 5/3559
348/300
2013/0215286 A1\* 8/2013 Ohya .................... H04N 5/378
348/222.1

FOREIGN PATENT DOCUMENTS

| JP | 2006148284 A | \* | 6/2006 | ............ H04N 5/335 |
| JP | 2008-271279 A | | 11/2008 | |
| JP | 2010-177321 A | | 8/2010 | |
| JP | 2012-120106 A | | 6/2012 | |
| JP | 2013-021533 A | | 1/2013 | |

\* cited by examiner

IMAGING DEVICE, DRIVING METHOD, AND ELECTRONIC APPARATUS

CROSS REFERENCE TO RELATED APPLICATIONS

This application is a U.S. National Phase of International Patent Application No. PCT/JP2015/079923 filed on Oct. 23, 2015, which claims priority benefit of Japanese Patent Application No. JP 2014-226695 filed in the Japan Patent Office on Nov. 7, 2014. Each of the above-referenced applications is hereby incorporated herein by reference in its entirety.

TECHNICAL FIELD

The present technology relates to an imaging device, a driving method, and an electronic apparatus, and more particularly, to an imaging device, a driving method, and an electronic apparatus capable of more quickly acquiring a high-quality image.

BACKGROUND ART

Conventionally, a solid-state imaging device is known which acquires an image by receiving light incident from a subject to each pixel, performing a photoelectric conversion thereof, and reading electric charge acquired as a result thereof from each pixel.

In a case where an image is captured using such a solid-state imaging device, when a high illuminance region and a low illuminance region are present together in a subject that is an imaging target, there are cases where so-called overexposure or underexposure occurs in a captured image.

Thus, a technology has been proposed in which a first charge accumulating unit and a second charge accumulating unit are disposed within a pixel of a solid-state imaging device, and the second charge accumulating unit is caused to function as a capacitor receiving electric charge that cannot be accumulated in the first charge accumulating unit, in other words, an overflow signal (for example, see Patent Document 1).

In such a solid-state imaging device, electric charge is accumulated only in the first charge accumulating unit at the time of low illuminance, and electric charge is accumulated in both the first charge accumulating unit and the second charge accumulating unit at the time of high illuminance, whereby an increase in the dynamic range of an image is realized. In other words, overexposure or underexposure is suppressed.

CITATION LIST

Patent Document

Patent Document 1: Japanese Patent Application Laid-Open No. 2013-21533

SUMMARY OF THE INVENTION

Problems to be Solved by the Invention

However, according to the technology described above, while the dynamic range is secured, and a high-quality image can be acquired, one of a signal for high illuminance and a signal for low illuminance is selected, and accordingly, it takes a time to read a signal acquired by an imaging process. In other words, since each of reading of a reset level and reading of a signal level is performed twice, an image cannot be quickly acquired.

The present technology is in consideration of such a situation and enables acquisition of a high-quality image more quickly.

Solutions to Problems

An imaging device of a first aspect of the present technology includes: a photoelectric conversion unit that performs a photoelectric conversion of incident light; an electric charge/voltage converting unit that converts a part or all of electric charge acquired by the photoelectric conversion into a voltage signal with predetermined conversion efficiency; and a signal comparing unit that compares the voltage signal with a reference signal of a predetermined voltage, wherein the conversion efficiency is changed in accordance with a result of the comparison performed by the signal comparing unit.

It may be configured such that the imaging device includes a plurality of pixels, and each of the pixels includes the photoelectric conversion unit and the electric charge/voltage converting unit.

The imaging device may further include a storage unit that stores a control signal determined on the basis of a result of the comparison and changes the conversion efficiency on the basis of the stored control signal.

It may be configured such that the imaging device further includes a capacitor that accumulates electric charge overflowing in the photoelectric conversion unit, and the storage unit changes the conversion efficiency by connecting the capacitor to the electric charge/voltage converting unit on the basis of the control signal.

It may be configured such that the signal comparing unit, after exposure of the photoelectric conversion unit, in a state in which electric charge transferred from the photoelectric conversion unit is accumulated in the electric charge/voltage converting unit, compares the voltage signal with the reference signal, and the storage unit, after the exposure, changes the conversion efficiency before the voltage signal corresponding to the electric charge accumulated in the electric charge/voltage converting unit is acquired as a signal level.

It may be configured such that a taking-in unit that acquires a digital value of the signal level on the basis of the result of the comparison between the voltage signal and the reference signal of a slope shape is further included, and the signal comparing unit, after the conversion efficiency is changed, in a state in which the electric charge transferred from the photoelectric conversion unit is accumulated in the electric charge/voltage converting unit, compares the voltage signal with the reference signal of the slope shape.

The taking-in unit may acquire a digital value of the signal level by taking in a count signal supplied from the outside on the basis of the result of the comparison.

It may be configured such that the signal comparing unit, in a reset state in which the electric charge/voltage converting unit is reset to a predetermined voltage, compares the voltage signal with the reference signal of the slope shape, and the taking-in unit further acquires a digital value of a reset level on the basis of the result of the comparison in the reset state.

It may be configured such that the taking-in unit outputs the digital value of the signal level and digital values of the reset levels acquired for a plurality of mutually-different conversion efficiencies, and the storage unit outputs a determination signal representing the conversion efficiency after the change that is determined according to the control signal.

It may be configured such that the imaging device includes a plurality of pixels, and each of the pixels includes the photoelectric conversion unit, the electric charge/voltage converting unit, and the signal comparing unit.

It may be configured such that the imaging device includes a plurality of pixels, and each of the pixels includes the photoelectric conversion unit, the electric charge/voltage converting unit, the signal comparing unit, and the storage unit.

It may be configured such that the imaging device includes a plurality of pixels, each of the pixels includes the photoelectric conversion unit, the electric charge/voltage converting unit, the signal comparing unit, and the storage unit, outputs an analog value of the voltage signal of a state in which electric charge transferred from the photoelectric conversion unit is accumulated in the electric charge/voltage converting unit, and outputs an analog value of the voltage signal of a reset state in which the electric charge/voltage converting unit is reset to a predetermined voltage acquired for each of a plurality of mutually-different conversion efficiencies, and the storage unit outputs a determination signal representing the conversion efficiency after the change that is determined according to the control signal.

In the imaging device, an electric charge maintaining unit that maintains electric charge transferred from the photoelectric conversion unit to the electric charge/voltage converting unit may be further included between the photoelectric conversion unit and the electric charge/voltage converting unit.

It may be configured such that the signal comparing unit compares the voltage signal with the reference signal immediately after transfer of electric charge from the photoelectric conversion unit to the electric charge/voltage converting unit, and the storage unit, after the transfer of the electric charge to the electric charge/voltage converting unit, changes the conversion efficiency before the voltage signal corresponding to electric charge accumulated in the electric charge/voltage converting unit is acquired as a signal level.

The storage unit may change the conversion efficiency by connecting a capacitor to the electric charge/voltage converting unit on the basis of the control signal.

The signal comparing unit and the storage unit may be disposed outside a pixel of the imaging device.

The imaging device may further include a pixel signal calculating unit that calculates a pixel signal formed by a signal level and a reset level by, after the conversion efficiency is changed, acquiring the signal level on the basis of a result of a comparison acquired by comparing the voltage signal with the reference signal of a slope shape in a state in which electric charge transferred from the photoelectric conversion unit is accumulated in the electric charge/voltage converting unit and acquiring the reset level on the basis of a result of a comparison acquired by comparing the voltage signal with the reference signal of the slope shape in a reset state in which the electric charge/voltage converting unit is reset to a predetermined voltage.

The pixel signal calculating unit may calculate the pixel signal by using the signal level and the reset level specified according to the control signal among the reset levels acquired for a plurality of mutually-different conversion efficiencies.

A driving method of a first aspect of the present technology is a method of driving an imaging device including: a photoelectric conversion unit that performs a photoelectric conversion of incident light; an electric charge/voltage converting unit that converts apart or all of electric charge acquired by the photoelectric conversion into a voltage signal with predetermined conversion efficiency; and a signal comparing unit that compares the voltage signal with a reference signal of a predetermined voltage, the method including: converting electric charge transferred from the photoelectric conversion unit into the voltage signal by using the electric charge/voltage converting unit; comparing the voltage signal with the reference signal by using the signal comparing unit; and changing the conversion efficiency in accordance with a result of the comparison using the signal comparing unit.

According to the first aspect of the present technology, in an imaging device including: a photoelectric conversion unit that performs a photoelectric conversion of incident light; an electric charge/voltage converting unit that converts a part or all of electric charge acquired by the photoelectric conversion into a voltage signal with predetermined conversion efficiency; and a signal comparing unit that compares the voltage signal with a reference signal of a predetermined voltage, electric charge transferred from the photoelectric conversion unit is converted into the voltage signal by the electric charge/voltage converting unit, the voltage signal and the reference signal are compared with each other, and the conversion efficiency is changed according to a result of the comparison.

An electronic apparatus of a second aspect of the present technology includes: a photoelectric conversion unit that performs a photoelectric conversion of incident light; an electric charge/voltage converting unit that converts a part or all of electric charge acquired by the photoelectric conversion into a voltage signal with predetermined conversion efficiency; and a signal comparing unit that compares the voltage signal with a reference signal of a predetermined voltage, wherein the conversion efficiency is changed in accordance with a result of the comparison performed by the signal comparing unit.

According to the second aspect of the present technology, in an electronic apparatus including: a photoelectric conversion unit that performs a photoelectric conversion of incident light; an electric charge/voltage converting unit that converts a part or all of electric charge acquired by the photoelectric conversion into a voltage signal with predetermined conversion efficiency; and a signal comparing unit that compares the voltage signal with a reference signal of a predetermined voltage, the conversion efficiency is changed in accordance with a result of the comparison performed by the signal comparing unit.

Effects of the Invention

According to the first and second aspects of the present technology, a high-quality image can be acquired more quickly.

Note that the effects are not necessarily limited to effects described here and may be any effects described in the present disclosure.

MODE FOR CARRYING OUT THE INVENTION

Hereinafter, embodiments of the present technology will be described with reference to the drawings.
<Overview of Present Technology>
<Example of Configuration of Circuit Realizing Present Technology>

The present technology relates to a solid-state imaging device such as a complementary metal oxide semiconductor (CMOS) image sensor, for example, including a pixel array unit formed on a chip (semiconductor substrate) and a peripheral circuit integrated on the chip. Hereinafter, an image captured by the solid-state imaging device will be referred to as a captured image.

In the pixel array unit of the solid-state imaging device according to the present technology, unit pixels (hereinafter, simply referred to as pixels) each including a photoelectric conversion unit that performs a photoelectric conversion for light incident from a subject are arranged in a row direction (horizontal direction) and a column direction (vertical direction), in other words, are two-dimensionally arranged in a matrix pattern. In addition, in the solid-state imaging device, an electric charge/voltage converting unit converting electric charge acquired by the photoelectric conversion unit into a voltage signal is also disposed, and, in the electric charge/voltage converting unit, the efficiency of the conversion of electric charge into a voltage signal is changed in multiple stages.

For example, in a case where a high-illuminance region and a low-illuminance region are present together in a subject that is an imaging target, when the conversion efficiency of the electric charge/voltage converting unit for all the pixels is set as conversion efficiency that is appropriate for high illuminance, the low illuminance region is underexposed. To the contrary, when the conversion efficiency of the electric charge/voltage converting unit for all the pixels is set as conversion efficiency that is appropriate for low illuminance, the high illuminance region is overexposed.

Thus, in the present technology, by adaptively changing the conversion efficiency of the electric charge/voltage converting unit in accordance with the amount of electric charge acquired by the photoelectric conversion unit for each pixel, in other words, a signal amount, a high-quality image can be acquired more quickly. In other words, by setting the conversion efficiency to be changeable for each pixel, the occurrence of underexposure or overexposure can be suppressed. In addition, by adaptively changing the conversion efficiency of the electric charge/voltage converting unit in accordance with a signal amount, the number of times of reading a voltage signal is decreased, whereby a captured image can be acquired more quickly.

Figure 1:
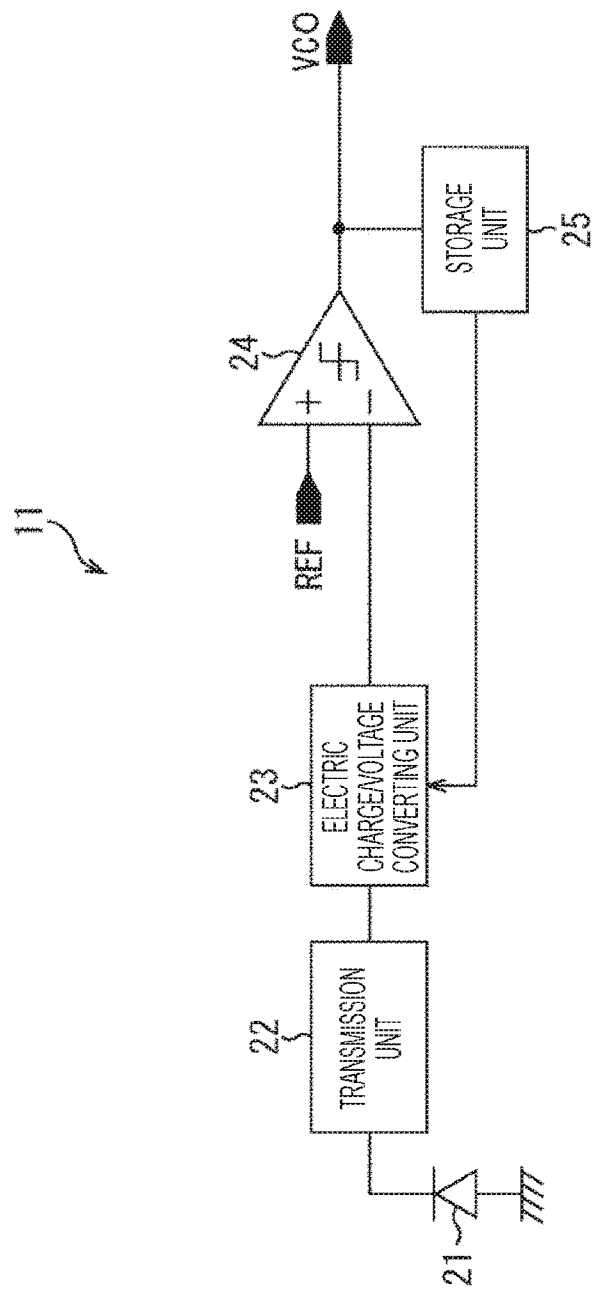
FIG. 1 is a diagram that illustrates an example of the configuration of a solid-state imaging device.

The present technology is realized by a circuit configuration, for example, illustrated in FIG. 1.

FIG. 1 illustrates a circuit that configures a part of a solid-state imaging device 11 according to the present technology, and, in this example, in the solid-state imaging device 11, a photoelectric conversion unit 21, a transmission unit 22, an electric charge/voltage converting unit 23, a signal comparator 24, and a storage unit 25 are disposed.

The photoelectric conversion unit 21 to the storage unit 25 described above are disposed on a same chip as that configuring the solid-state imaging device 11 or a plurality of stacked chips. In addition, for example, the photoelectric conversion unit 21 to the electric charge/voltage converting unit 23 are disposed in each of a plurality of pixels disposed in the solid-state imaging device 11. Furthermore, the signal comparator 24 and the storage unit 25 may be disposed in each pixel or may be disposed to be common to several pixels, in other words, several photoelectric conversion units 21.

The photoelectric conversion unit 21, for example, is formed by a photodiode or the like and generates electric charge in accordance with the amount of incident light, in other words, the amount of received light by performing a photoelectric conversion of the light incident from an imaging target. The transmission unit 22 transmits the electric charge acquired by the photoelectric conversion unit 21 to the electric charge/voltage converting unit 23. Here, two or more transmission units 22 may be disposed.

The electric charge/voltage converting unit 23 accumulates electric charge supplied from the photoelectric conversion unit 21 through the transmission unit 22, converts a part or the whole of the accumulated electric charge into a voltage signal representing a signal amount with predetermined conversion efficiency, and supplies the converted voltage signal to the signal comparator 24. The electric charge/voltage converting unit 23 has a configuration in which the switching of the conversion efficiency can be performed in a plurality of steps of two or more.

The signal comparator 24 compares a reference signal supplied from the outside with a voltage signal supplied from the electric charge/voltage converting unit 23 and outputs a result of the comparison.

In the solid-state imaging device 11, on the basis of a result of the comparison output from the signal comparator 24 or a voltage signal output from the electric charge/voltage converting unit 23, a pixel signal (pixel value) representing a signal amount acquired by each pixel is generated, and an image signal of a captured image formed by pixel signals of pixels is acquired.

In addition, the result of the comparison acquired by the signal comparator 24 is supplied also to the storage unit 25. The storage unit 25 is formed by N-bit memory or the like and stores a result of the comparison supplied from the signal comparator 24, and more particularly, a control signal used for switching of conversion efficiency in accordance with a result of the comparison. In addition, by supplying a stored control signal to the electric charge/voltage converting unit 23, the storage unit 25 changes the conversion efficiency of the electric charge/voltage converting unit 23.

In other words, the change in the conversion efficiency of the electric charge/voltage converting unit 23 is controlled using a control signal.

In this way, in the solid-state imaging device 11, the conversion efficiency of the electric charge/voltage converting unit 23 is adaptively changed on the basis of whether a voltage signal representing a signal amount, which is output from the electric charge/voltage converting unit 23 is higher or lower than a reference signal.

First Embodiment

<Example of Configuration of Pixel>

Next, a solid-state imaging device according to an embodiment of the present technology will be described.

Figure 2:
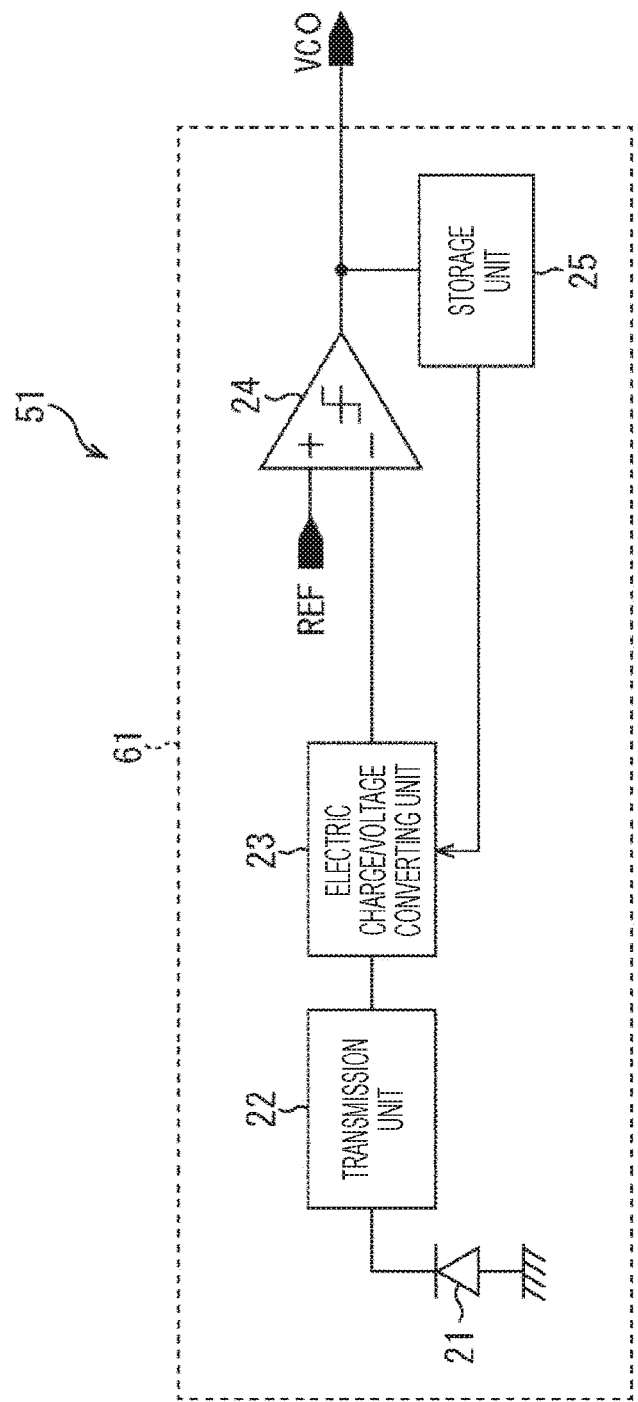
FIG. 2 is a diagram that illustrates an example of the configuration of a pixel of a solid-state imaging device.

In the solid-state imaging device according to this embodiment, for example, as illustrated in FIG. 2, the photoelectric conversion unit 21 to the storage unit 25 described above are disposed for each pixel. Note that, in FIG. 2, a same reference numeral is assigned to a part corresponding to that of the case illustrated in FIG. 1, and the description thereof will not be presented as is appropriate.

FIG. 2 is a diagram that illustrates of a part of a circuit disposed within a pixel of the solid-state imaging device 51 according to the present technology. In this example, the pixel 61 disposed in the solid-state imaging device 51 includes a photoelectric conversion unit 21, a transmission unit 22, an electric charge/voltage converting unit 23, a signal comparator 24, and a storage unit 25. The connection relations and the operations of such devices are as illustrated in the example illustrated in FIG. 1. In addition, in this example, only the photoelectric conversion unit 21 to the storage unit 25 are illustrated, other circuits and the like are included within the pixel 61. Also in this example, a plurality of the transmission units 22 may be disposed.

In a pixel array unit of the solid-state imaging device 51, a plurality of the pixels 61 are arranged in a matrix pattern.

Modified Example 1 of First Embodiment

<Example of Configuration of Pixel>

In addition, an analog-to-digital (AD) conversion of a voltage signal may be performed by using the signal comparator 24 disposed in the pixel 61 illustrated in FIG. 2. In such a case, on the output side of the signal comparator 24, for example, a mechanism for latching a count signal that is externally counted, an up-down counter, and the like are further disposed, and a signal of which the voltage value changes in a slope shape with respect to time is supplied to the signal comparator 24 as a reference signal at the time of performing an AD conversion.

Figure 3:
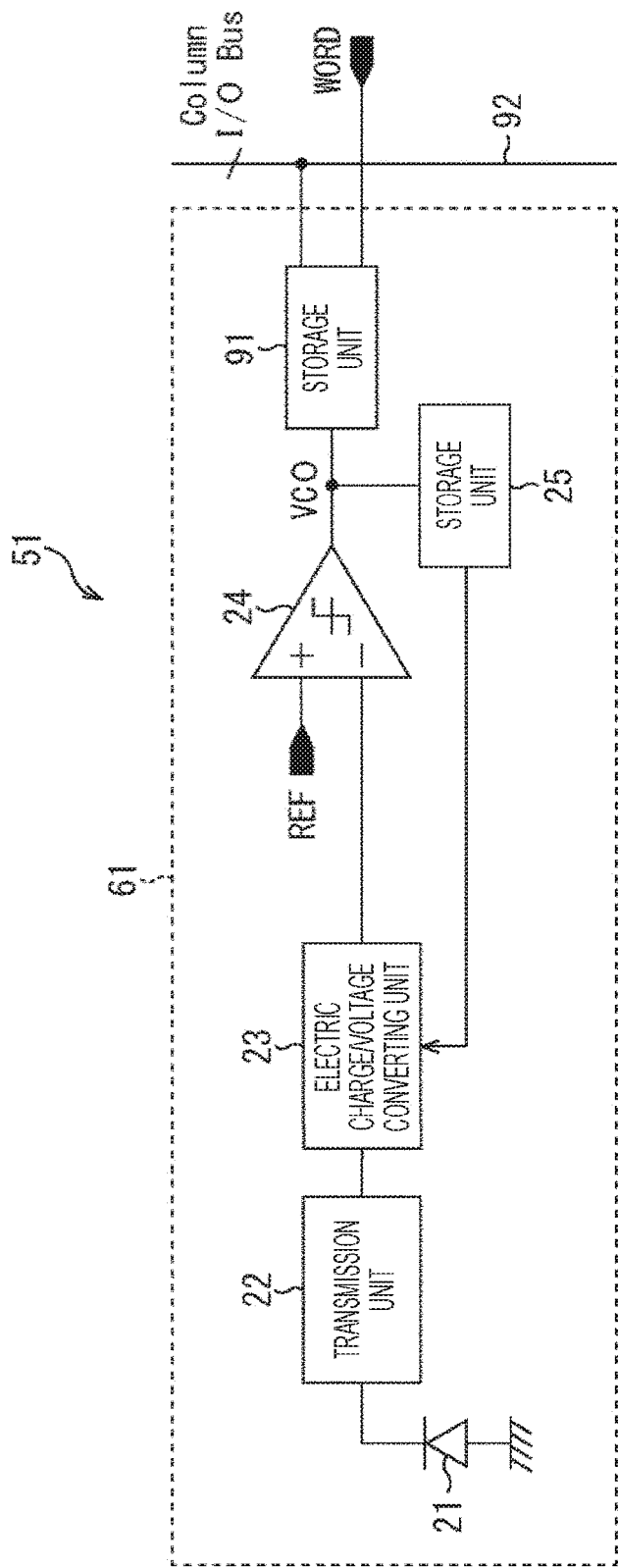
FIG. 3 is a diagram that illustrates an example of the configuration of a pixel of a solid-state imaging device.

For example, a storage unit such as a memory or the like is disposed on the output side of the signal comparator 24, and, in a case where an AD conversion is realized by latching a count signal transmitted to each pixel 61 from an external counter, the pixel 61 has a configuration illustrated in FIG. 3. Note that, in FIG. 3, a same reference numeral is assigned to a part corresponding to that of the case illustrated in FIG. 2, and the description thereof will not be presented as is appropriate.

In the example illustrated in FIG. 3, in the pixel 61 of the solid-state imaging device 51, a storage unit 91 is further disposed in addition to the photoelectric conversion unit 21 to the storage unit 25.

The storage unit 91, for example, is formed by M-bit memory or the like and is connected to an output-side terminal of the signal comparator 24 and an output signal line 92. The storage unit 91, on the basis of a result of the comparison supplied from the signal comparator 24, latches (takes in) a count signal supplied from the outside through an output signal line 92. At this time, a count signal that is temporarily stored in the storage unit 91, in other words, a latched count signal has a value that is acquired by performing an AD conversion of a voltage signal representing the signal amount of the electric charge/voltage converting unit 23.

When the pixel 61 in which the storage unit 91 is disposed is selected according to a control signal WORD used for selecting a pixel row formed by a plurality of pixels 61 aligned in a row direction, the storage unit 91 outputs a stored (maintained) value to the output signal line 92 as an output voltage signal acquired by performing an AD conversion of a voltage signal output from the electric charge/voltage converting unit 23 together with a signal of application information of conversion efficiency switching.

<Example of Configuration of Imaging Device>

Subsequently, a more specific embodiment of the solid-state imaging device 51 of a case where the signal comparator 24 is also used for an AD conversion as described with reference to FIG. 3 will be described.

Figure 4:
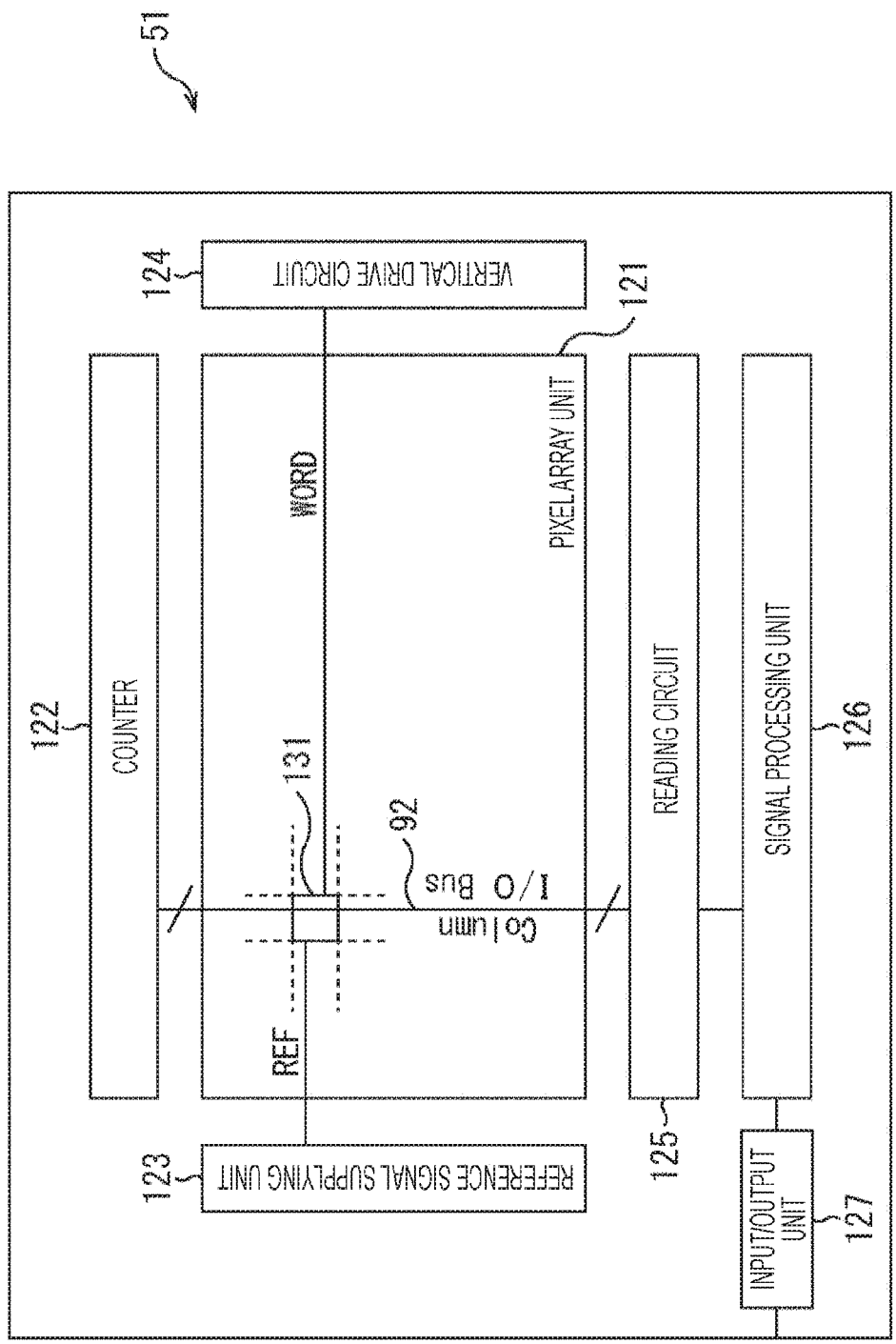
FIG. 4 is a diagram that illustrates an example of the configuration of a solid-state imaging device.

FIG. 4 is a diagram that illustrates an example of the specific configuration of the solid-state imaging device 51. Note that, in FIG. 4, a same reference numeral is assigned to a part corresponding to that of the case illustrated in FIG. 3, and the description thereof will not be presented as is appropriate.

In the solid-state imaging device 51 illustrated in FIG. 4, a pixel array unit 121, a counter 122, a reference signal supplying unit 123, a vertical drive circuit 124, a reading circuit 125, a signal processing unit 126, and an input/output unit 127 are disposed on one chip.

In the pixel array unit 121, a plurality of pixels 131 having a configuration similar to that of the pixel 61 illustrated in FIG. 3 are arranged. Note that, in FIG. 4, while only one pixel 131 is illustrated in the pixel array unit 121, actually, the plurality of pixels 131 are disposed.

Each pixel 131 disposed in the pixel array unit 121 is connected to the counter 122 and the reading circuit 125 through the output signal line 92, and, for example, a plurality of pixels 131 aligned in the vertical direction in the drawing, in other words, in a column (vertical direction) are connected to one output signal line 92.

In addition, a plurality of pixels 131 aligned in the horizontal direction in the drawing, in other words, a row direction (horizontal direction) are connected to the reference signal supplying unit 123 through a control line that is long in the horizontal direction. In addition, the plurality of pixels 131 aligned in the row direction are connected also to the vertical drive circuit 124 through another control line that is long in the horizontal direction.

The counter 122, for example, is formed by a gray code counter or the like and supplies a count signal (clock signal) to the pixel 131 through the output signal line 92. The reference signal supplying unit 123 supplies a reference signal to the pixel 131 through a control signal.

For example, when a voltage signal is compared with the reference signal used for determining the conversion efficiency, the reference signal supplying unit 123 supplies the reference signal of a constant voltage (also referred to as a determination level) to the pixel 131. In contrast to this, when an AD conversion is performed for acquiring a pixel signal, the reference signal supplying unit 123 supplies a signal (hereinafter, also simply referred to as a slope) having a slope shape in which a voltage linearly decreases with respect to time to the pixel 131 as the reference signal.

By supplying a control signal WORD to the pixel 131 through a control line, the vertical drive circuit 124 selects pixels 131 in units of one row. The reading circuit 125 reads an AD-converted signal from the pixel 131 through the output signal line 92 and supplies the read signal to the signal processing unit 126.

The signal processing unit 126 calculates a pixel signal of each pixel 131 through calculation on the basis of a signal supplied from the reading circuit 125, thereby acquiring an image signal of a captured image formed from the acquired pixel signal of each pixel 131. In addition, the signal processing unit 126, for an acquired image signal, performs various image processing such as black level adjustment, demosaic, and the like and supplies a resultant signal to the input/output unit 127.

The input/output unit 127 is connected to a block of a later stage outside the chip and transmits/receives information to/from the connected block. For example, the input/output unit 127 outputs an image signal of a captured image supplied from the signal processing unit 126 to a block of a later stage.

In the solid-state imaging device 51 having such a configuration, for example, an AD conversion is performed for a reset level, which is a level functioning as a reference at the time of calculating a pixel signal, and a signal level acquired as the pixel 131 receives light from a subject, and the converted levels are supplied to the reading circuit 125.

Here, the reset level is the level (voltage) of a voltage signal acquired by the electric charge/voltage converting unit in a reset state in which the electric charge/voltage converting unit is reset (initialized) to a predetermined voltage. In addition, the signal level is the level (voltage) of a voltage signal acquired by the electric charge/voltage converting unit in a state in which apart or the whole of electric charge acquired by the photoelectric conversion unit is accumulated in the electric charge/voltage converting unit.

In the solid-state imaging device 51, within the pixel 131, a voltage signal is acquired as a reset level, and an AD conversion is performed for the acquired voltage signal on the basis of a reference signal supplied from the reference signal supplying unit 123 and a count signal supplied from the counter 122. Then, when the pixel 131 is selected using the control signal WORD, the AD-converted reset level is supplied to the signal processing unit 126 through the reading circuit 125.

In addition, in the pixel 131, after the exposure of the pixel 131, a voltage signal according to electric charge accumulated in the pixel 131 is compared with the reference signal (determination level), then, after the conversion efficiency is adaptively changed, a voltage signal as a signal level is acquired. Then, an AD conversion is performed for the acquired voltage signal on the basis of the reference signal supplied from the reference signal supplying unit 123 and the count signal supplied from the counter 122, and, when the pixel 131 is selected using the control signal WORD, the AD-converted signal level is supplied to the signal processing unit 126 through the reading circuit 125.

In the signal processing unit 126, a pixel signal is calculated on the basis of the reset level and the signal level read by the reading circuit 125.

Note that, in the solid-state imaging device 51 illustrated in FIG. 4, various kinds of drivers, control lines used for the initialization of the conversion efficiency in the pixel 131 and the control of the signal comparator, and the like are not illustrated. In addition, the configuration illustrated in FIG. 4 is an example of the arrangement of the pixel array unit 121 and the peripheral circuits thereof, but the present technology is not limited thereto.

<Example of Configuration of Pixel>

Figure 5:
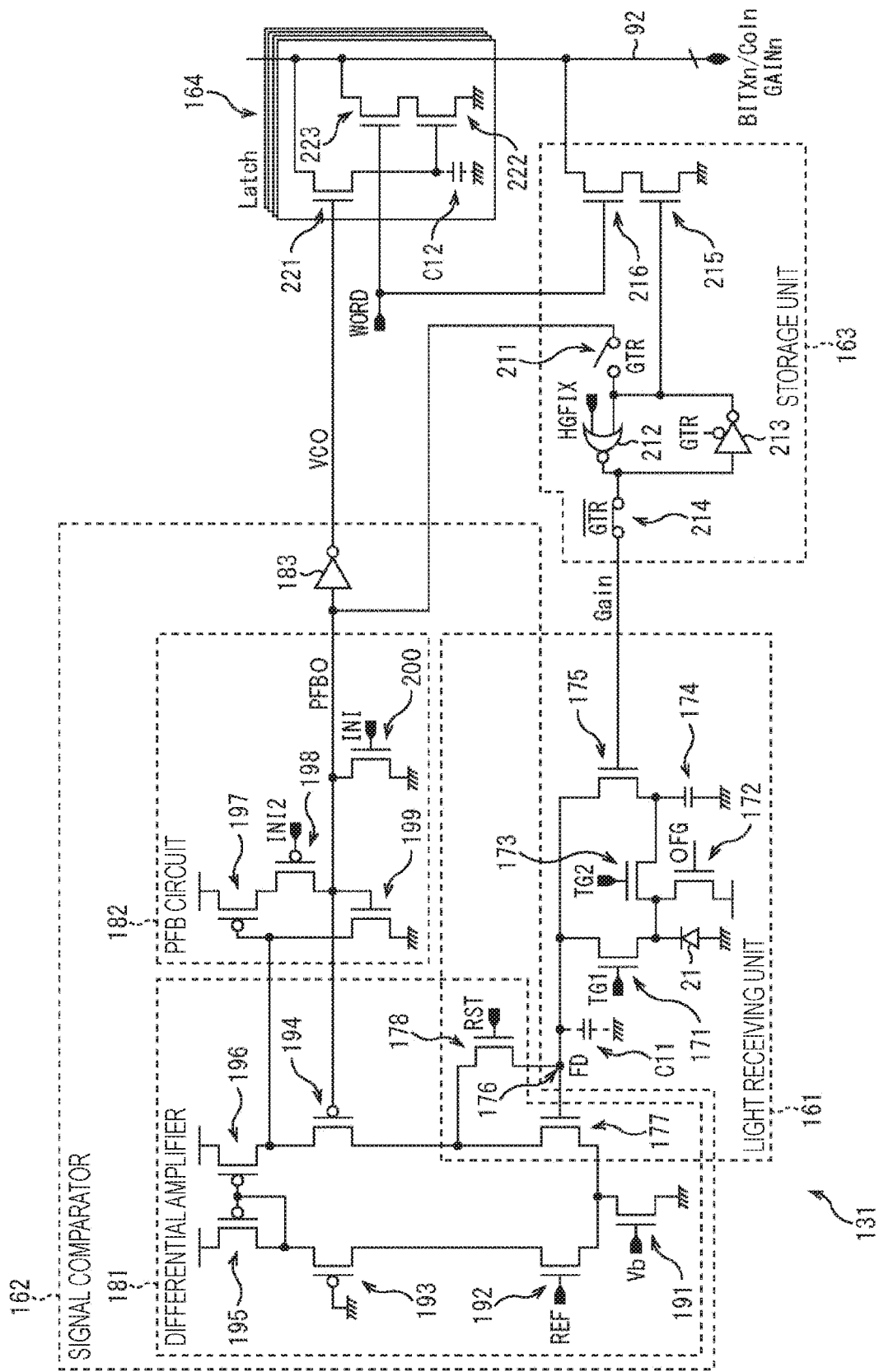
FIG. 5 is a diagram that illustrates an example of the configuration of a pixel of a solid-state imaging device.

Described in more detail, the pixel 131 illustrated in FIG. 4, for example, is configured as illustrated in FIG. 5. In addition, in FIG. 5, a same reference numeral is assigned to apart corresponding to that of the case illustrated in FIG. 3, and the description thereof will not be presented as is appropriate.

The pixel 131 illustrated in FIG. 5 includes a light receiving unit 161, a signal comparator 162, a storage unit 163, and a storage unit 164.

In this example, the light receiving unit 161 receives light from a subject, performs a photoelectric conversion of the received light, and outputs a voltage signal corresponding to the acquired electric charge. Here, the signal comparator 162, for example, corresponds to the signal comparator 24 illustrated in FIG. 3, and the storage unit 163 and the storage unit 164 respectively correspond to the storage unit 25 and the storage unit 91 illustrated in FIG. 3. In addition, the light receiving unit 161 and the signal comparator 162 share a part of elements.

The light receiving unit 161 includes a photoelectric conversion unit 21, a transfer transistor 171, a charge discharging transistor 172, a transistor 173, a capacitor 174, a transistor 175, an electric charge/voltage converting unit 176, an amplification transistor 177, and a reset transistor 178.

The transfer transistor 171 is disposed between the photoelectric conversion unit 21 and the electric charge/voltage converting unit 176 and, for example, corresponds to the transmission unit 22 illustrated in FIG. 3. For example, when a drive signal TG1 supplied to the gate electrode of the transfer transistor 171 becomes a high level, the transfer transistor 171 is in a conductive state, in other words, an On state, and the transfer transistor 171 transfers electric charge accumulated in the photoelectric conversion unit 21 to the electric charge/voltage converting unit 176.

The charge discharging transistor 172 is connected to the photoelectric conversion unit 21 and, when a drive signal OFG supplied to the gate electrode of the charge discharging transistor 172 becomes a high level, discharges electric charge accumulated in the photoelectric conversion unit 21 to the outside.

One of the source/drain regions of the transistor 173 is connected to the photoelectric conversion unit 21 and the charge discharging transistor 172, and the other of the source/drain regions of the transistor 173 is connected to the capacitor 174. A drive signal TG2 of a constant voltage is constantly supplied to the gate electrode of the transistor 173, and the transistor 173 functions as an overflow path for transmitting electric charge overflowing from the photoelectric conversion unit 21 to the capacitor 174.

The capacitor 174 is connected to the transistor 173 and the transistor 175 and accumulates electric charge transferred from the photoelectric conversion unit 21 through the transistor 173. In other words, the capacitor 174 accumulates electric charge overflowing from the photoelectric conversion unit 21.

The transistor 175 is disposed between the capacitor 174 and the electric charge/voltage converting unit 176 and, when a control signal Gain supplied to the gate electrode of the transistor 175 is in the high level, is in the On state and electrically connects the capacitor 174 and the electric charge/voltage converting unit 176.

In other words, in a case where the control signal Gain is in the low level, a state is formed in which the capacitor 174 and the electric charge/voltage converting unit 176 are electrically separate from each other. In contrast to this, in a case where the control signal Gain is in the high level, a state is formed in which the capacitor 174 and the electric charge/voltage converting unit 176 are electrically connected to each other, and the charge storage capacitance of the capacitor 174 is added to the electric charge/voltage converting unit 176.

The electric charge/voltage converting unit 176 includes parasitic capacitance C11 and is connected to the source/drain region of the transfer transistor 171, the source/drain region of the transistor 175, the source/drain region of the reset transistor 178, and the gate electrode of the amplification transistor 177.

The electric charge/voltage converting unit 176 is a floating diffusion region that accumulates electric charge transferred from the photoelectric conversion unit 21 through the transfer transistor 171, converts the accumulated electric charge into a voltage signal, and outputs the converted voltage signal.

For example, in a case where the control signal Gain is in the low level, the capacitor 174 and the electric charge/voltage converting unit 176 are electrically separate from each other, and the charge accumulation capacitance of the electric charge/voltage converting unit 176 is only the parasitic capacitance C11. In this state, the conversion efficiency of electric charge into a voltage signal in the electric charge/voltage converting unit 176 is high and is in a high-gain state.

In contrast to this, in a case where the control signal Gain is in the high level, a state is formed in which the capacitor 174 is electrically connected to the electric charge/voltage converting unit 176, and the charge accumulation capacitance of the electric charge/voltage converting unit 176 is increased by an amount corresponding to the capacitor 174. In such a case, the amount of electric charge required to change the electric potential of the electric charge/voltage converting unit 176 is increased, and accordingly, the conversion efficiency in the electric charge/voltage converting unit 176 is decreased and is in a state of low conversion efficiency, in other words, a low gain.

In the pixel 131, the electric charge/voltage converting unit 176 corresponds to the electric charge/voltage converting unit 23 illustrated in FIG. 3, and the conversion efficiency is changed as the capacitor 174 is connected to the electric charge/voltage converting unit 176.

The amplification transistor 177 outputs a voltage signal acquired by the electric charge/voltage converting unit 176 as a current signal.

One source/drain region of the reset transistor 178 is connected to the electric charge/voltage converting unit 176, and the other source/drain region of the reset transistor 178 is connected to the source/drain region of the amplification transistor 177.

When a drive signal RST supplied to the gate electrode of the reset transistor 178 is in the high level, the reset transistor 178 is in the On state and initializes the electric charge/voltage converting unit 176 and the signal comparator 162.

In addition, the signal comparator 162 compares a voltage signal supplied from the light receiving unit 161 with a reference signal REF supplied from the reference signal supplying unit 123 and outputs a result of the comparison to the storage unit 163 and the storage unit 164.

The signal comparator 162 is configured by a differential amplifier 181 disposed on a first stage, a positive feedback (PFB) circuit 182 disposed on a second stage, and an inverter 183 disposed on the output side.

In the differential amplifier 181, the amplification transistor 177 and the reset transistor 178, which are parts of the light receiving unit 161, a transistor 191, a transistor 192, a transistor 193, a transistor 194, a transistor 195, and a transistor 196 are disposed.

One source/drain region of the transistor 191 is grounded, and the other source/drain region of the transistor 191 is connected to the amplification transistor 177 and the transistor 192. In addition, a voltage signal Vb of a constant voltage is supplied to the gate electrode of the transistor 191 that is a current source. Note that, hereinafter, a voltage applied to the gate electrode of the transistor 191 will be also referred to as the voltage Vb.

The transistor 192 is disposed between the transistor 191 and the amplification transistor 177 and the transistor 193, and the reference signal REF is supplied to the gate electrode of the transistor 192. In addition, the amplification transistor 177 generates a current signal corresponding to a voltage difference between the amount of electric charge accumulated in the electric charge/voltage converting unit 176 connected to the gate electrode, in other words, a voltage and a voltage of the reference signal REF supplied to the gate electrode of the transistor 192 forming a pair with the amplification transistor 177. Accordingly, a voltage signal corresponding to the current signal generated by the amplification transistor 177 is output to the PFB circuit 182 of a later stage.

The transistor 193 is formed by a pMOS transistor and is disposed between the transistor 192 and the transistor 195. The gate electrode of the transistor 193 is grounded, and the transistor 193 is in a constantly-On state.

The transistor 194 is formed by a pMOS transistor. One source/drain region of the transistor 194 is connected to the source/drain region of the transistor 196 and the input side of the PFB circuit 182, and the other source/drain region of the transistor 194 is connected to the source/drain region of the amplification transistor 177 and the source/drain region of the reset transistor 178. In addition, the gate electrode of the transistor 194 is connected to the output side of the PFB circuit 182, and the transistor 194 performs power control of the signal comparator 162.

The transistor 195 is formed by a pMOS transistor and is connected to the transistor 192 through the transistor 193. The transistor 196 is formed by a pMOS transistor and is connected to the amplification transistor 177 and the reset transistor 178 through the transistor 194.

In addition, the gate electrode of the transistor 195 and the gate electrode of the transistor 196 are connected, and the source/drain region of the transistor 195 that is disposed on the transistor 193 side is also connected to the gate electrode of the transistor 195. In the differential amplifier 181, a current mirror circuit is configured by the transistor 195 and the transistor 196.

The differential amplifier 181 configured in this way compares a voltage signal acquired by the electric charge/voltage converting unit 176 with the reference signal REF and outputs a result of the comparison to the PFB circuit 182. In other words, a voltage signal (current) corresponding to a difference between the voltage signal acquired by the electric charge/voltage converting unit 176 and the reference signal REF is output as a result of the comparison.

The PFB circuit 182 increases the operation speed of the signal comparator 162 by applying a positive feedback to the result of the comparison supplied from the differential amplifier 181 and supplies the result of the comparison to the inverter 183.

In the PFB circuit 182, a transistor 197, a transistor 198, a transistor 199, and a transistor 200 are disposed.

The transistor 197 is formed by a pMOS transistor, and the gate electrode of the transistor 197 is connected to the source/drain region of the transistor 196 that is disposed on the transistor 194 side. In addition, the transistor 198 is formed by a pMOS transistor, one source/drain region of the transistor 198 is connected to the source/drain region of the transistor 197, and the other source/drain region of the transistor 198 is connected to the gate electrode of the transistor 199.

A drive signal INI2 used for electrically connecting the source/drain region of the transistor 197 and the gate electrode of the transistor 199 is supplied to the gate electrode of the transistor 198. When the drive signal INI2 is in the low level, the transistor 198 is in the On state, and the transistor 197 and the transistor 199 are connected to each other.

One source/drain region of the transistor 199 is grounded, and the other source/drain region of the transistor 199 is connected to the gate electrode of the transistor 197 and the source/drain region of the transistor 196 that is disposed on the transistor 194 side.

In addition, the gate electrode of the transistor 194 and the transistor 200 are connected to the source/drain region of the transistor 198 that is disposed on the transistor 199 side. A drive signal INI used for initializing the PFB circuit 182 is supplied to the gate electrode of the transistor 200, and, when the drive signal INI is at the high level, the PFB circuit 182 is reset.

In addition, the inverter 183 and the storage unit 163 are connected to the source/drain region of the transistor 198 that is disposed on the transistor 199 side. The inverter 183 inverts a voltage signal (hereinafter, also referred to as a voltage signal PFBO) supplied from the transistor 198, in other words, a result of the comparison performed by the differential amplifier 181 and supplies the inverted voltage signal to the storage unit 164.

Here, in a case where the voltage signal acquired by the electric charge/voltage converting unit 176 is higher (larger) than the reference signal REF, a voltage signal VCO of the low level is output from the inverter 183. On the other hand, in a case where the voltage signal acquired by the electric charge/voltage converting unit 176 is lower (smaller) than the reference signal REF, a voltage signal VCO of the high level is output from the inverter 183.

The storage unit 163 is supplied with the voltage signal PFBO representing the result of the comparison from the transistor 198, stores a control signal Gain corresponding to the voltage signal PFBO, and supplies the control signal Gain to the gate electrode of the transistor 175. The storage unit 163 connects or disconnects the capacitor 174 to/from the electric charge/voltage converting unit 176 by turning on or off the transistor 175 by using the control signal Gain, thereby controlling the switching of the conversion efficiency.

In addition, the storage unit 163 outputs a gain determination signal representing the state of the control signal Gain, in other words, a high-gain (high conversion efficiency) state or a low-gain (low conversion efficiency) state to the output signal line 92.

The storage unit 163 includes a switch 211, a NOR gate 212, an inverter 213, a switch 214, a transistor 215, and a transistor 216.

When the supplied drive signal GTR becomes the high level, the switch 211 is turned on and supplies the voltage signal PFBO supplied from the transistor 198 to the input terminal of the NOR gate 212. On the other hand, when the drive signal GTR becomes the low level, the switch 211 is turned off.

The NOR gate 212 supplies a control signal Gain having a value that is determined using an input control signal HGFIX and a voltage signal PFBO supplied from the switch 211 or a signal supplied from the inverter 213 to the switch 214 and the inverter 213. In other words, the control signal Gain output from the NOR gate 212 is supplied to the gate electrode of the transistor 175 through the switch 214. A drive signal GTR is supplied to this switch 214. When the supplied drive signal GTR is in the high level, the switch 214 is turned off. On the other hand, when the drive signal GTR is in the low level, the switch 214 is turned on.

When the supplied drive signal GTR is in the low level, the inverter 213 operates, inverts the control signal Gain supplied from the NOR gate 212, and supplies the inverted control signal to the gate electrode of the transistor 215 and the NOR gate 212.

Accordingly, in a case where the drive signal GTR is in the high level, a voltage signal PFBO supplied from the switch 211 is supplied to the input terminal of the NOR gate 212. On the other hand, in a case where the drive signal GTR is in the low level, the inverted control signal Gain supplied from the inverter 213 is supplied to the input terminal of the NOR gate 212.

The transistor 215 outputs a gain determination signal in accordance with the voltage signal supplied from the inverter 213 to the gate electrode of the transistor 215, in other words, the inverted control signal Gain. One source/drain region of the transistor 215 is grounded, and the other source/drain region of the transistor 215 is connected to the source/drain region of the transistor 216.

In accordance with the control signal WORD supplied from the outside to the gate electrode of the transistor 216, the transistor 216 outputs the gain determination signal supplied from the transistor 215 to the output signal line 92. The gain determination signal output in accordance with the control signal WORD is a signal representing the conversion efficiency after a necessary change.

The storage unit 164 is formed by a plurality of D-latch circuits and latches (takes in) a count signal supplied from the counter 122 through the output signal line 92 in accordance with the voltage signal VCO supplied from the inverter 183 of the signal comparator 162, thereby acquiring an AD-converted reset level or signal level. In addition, the storage unit 164 outputs the acquired reset level or signal level after the AD conversion to the reading circuit 125 through the output signal line 92.

Each D-Latch circuit configuring the storage unit 164 includes a transistor 221, a transistor 222, and a transistor 223.

The inverter 183 is connected to the gate electrode of the transistor 221. The output signal line 92 is connected to one source/drain region of the transistor 221, and the gate electrode of the transistor 222 is connected to the other source/drain region of the transistor 221. In addition, parasitic capacitance C12 is present between the source/drain region of the transistor 221 and the gate electrode of the transistor 222. In addition, in a case where there is room in the area, not the parasitic capacitance C12 but a capacitor may be disposed between the source/drain region of the transistor 221 and the gate electrode of the transistor 222.

When the voltage signal VCO supplied from the inverter 183 to the gate electrode is in the high level, the transistor 221 is in the On state and supplies a count signal supplied from the counter 122 through the output signal line 92 to the parasitic capacitance C12.

A signal formed from a count signal maintained in the parasitic capacitance C12 of each D-latch circuit as an electric charge is in the reset level or the signal level after the AD conversion. In other words, the parasitic capacitance C12 of each D-latch circuit maintains a signal corresponding to one bit of the reset level or the signal level.

One source/drain region of the transistor 222 is grounded, and the other source/drain region of the transistor 222 is connected to the source/drain region of the transistor 223. The transistor 222 outputs a signal corresponding to a count signal (electric charge) maintained in the parasitic capacitance C12. One source/drain region of the transistor 223 is connected to the output signal line 92, and the other source/drain region of the transistor 223 is connected to the source/drain region of the transistor 222.

The transistor 223 outputs a signal supplied from the transistor 222 to the output signal line 92 in accordance with a control signal WORD supplied from the outside to the gate electrode of the transistor 223.

<Description of Imaging Process>

Subsequently, the operation of the solid-state imaging device 51 illustrated in FIG. 4 will be described.

When an imaging direction is performed, the solid-state imaging device 51 performs an imaging process by driving each unit of the solid-state imaging device 51 and outputs an acquired captured image. Hereinafter, the imaging process performed by the solid-state imaging device 51 will be described with reference to a timing diagram illustrated in FIG. 6.

Figure 6:
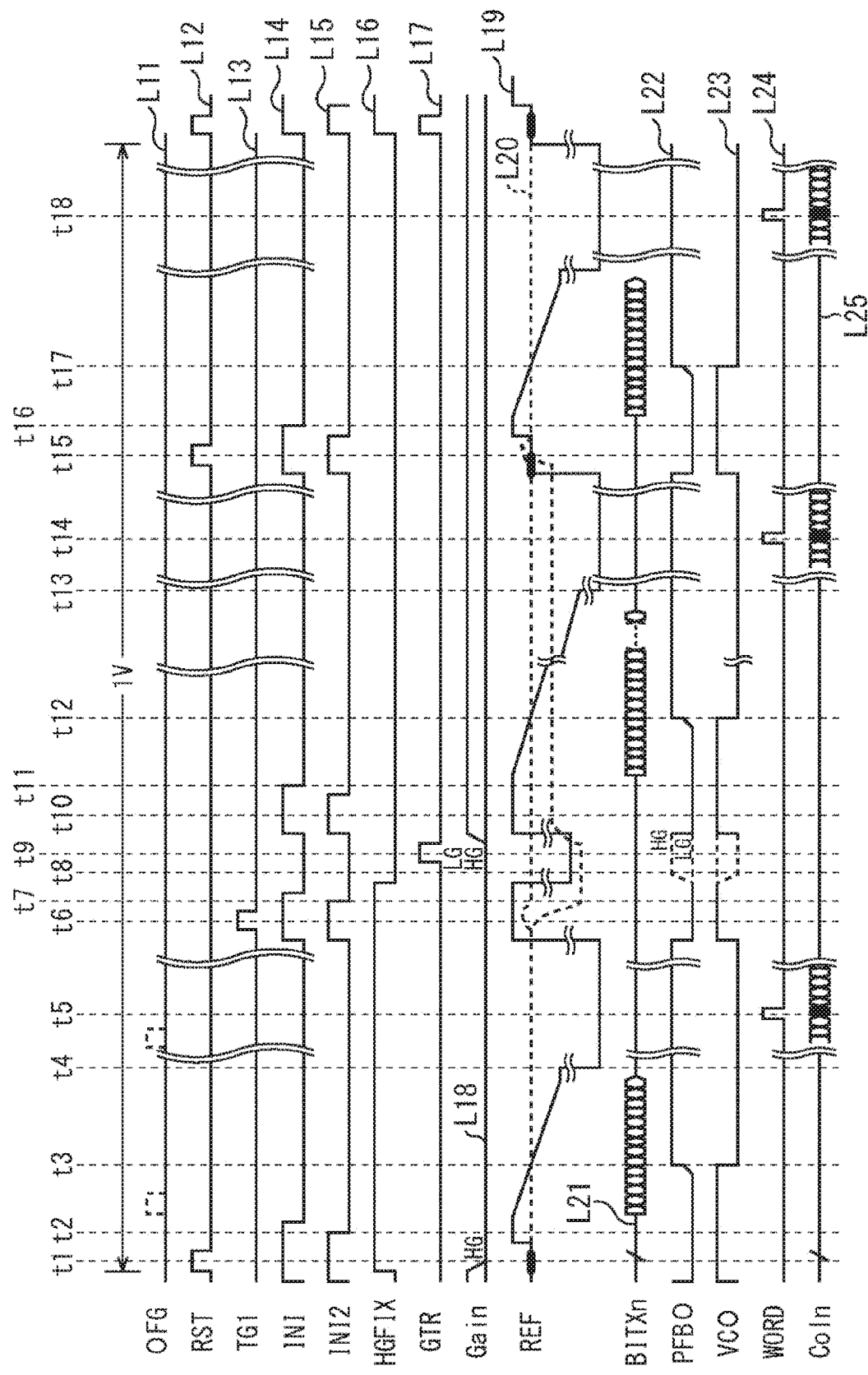
FIG. 6 is a timing diagram that illustrates an imaging process.

Note that, in FIG. 6, the horizontal direction represents the time, and the vertical direction represents the electric potential (voltage). Particularly, in the drawing, a state in which a signal or the like that upwardly protrudes represents a high-level state, and a state in which a signal or the like that downwardly protrudes represents a low-level state.

In FIG. 6, polygonal lines L11 to L19 represent the waveforms of a drive signal OFG, a drive signal RST, a drive signal TG1, a drive signal INI, a drive signal INI2, a control signal HGFIX, a drive signal GTR, a control signal Gain, and a reference signal REF. In addition, a curve L20 of a dotted line represents the voltage (hereinafter, also referred to as a voltage FD) of the electric charge/voltage converting unit 176, in other words, a voltage signal acquired by the electric charge/voltage converting unit 176.

In addition, polygonal lines L21 to L24 respectively represent a count signal BITXn, a voltage signal PFBO, a voltage signal VCO, and a control signal WORD. The count signal BITXn is a count signal output from the counter 122. A polygonal line L25 represents the electric potential Coln of the output signal line 92, in other words, the reset level or the signal level read through the output signal line 92.

When the imaging process is started, first, at time t1, the drive signal RST is set to the high level, the reset transistor 178 is turned on, and the electric charge/voltage converting unit 176 and the differential amplifier 181 are initialized to a predetermined voltage. In addition, the drive signal INI and the drive signal INI2 are set to the high level, the transistor 198 is turned off, and the transistor 200 is turned on, whereby the PFB circuit 182 is initialized. At this time, the transistor 194 becomes the On state.

In addition, a control signal HGFIX supplied to the NOR gate 212 is set to the high-level state. In the state in which the control signal HGFIX is in the high level, the control signal Gain becomes the low level. Accordingly, in the pixel 131, a state in which the capacitor 174 is electrically separate from the electric charge/voltage converting unit 176, in other words, a high-gain state is formed.

Subsequently, the drive signal RST is set to the low level, the reset transistor 178 is turned off, and accordingly, a threshold variation of the differential amplifier 181 is stored. In other words, the reference signal REF and the voltage FD of the electric charge/voltage converting unit 176 become the same, and the influence of variations of each differential amplifier 181 disappears.

In addition, at time t2, after the drive signal INI2 is set to the low level, and the transistor 198 is turned on, the drive signal INI is set to the low level, and the initialization is released. In addition, by raising the level of the reference signal REF supplied to the transistor 192 up to a predetermined level, the reference signal supplying unit 123 prepares the start of an AD conversion.

In addition, in a case where exposure adjustment is required, after the drive signal OFG is set to the high level, the charge discharging transistor 172 is turned on, and the photoelectric conversion unit 21 is initialized, the drive signal OFG is further set to the low level, and the charge discharging transistor 172 is turned off. When the charge discharging transistor 172 is turned off, the exposure of the photoelectric conversion unit 21 (pixel 131), in other words, a photoelectric conversion and accumulation of electric charge in the photoelectric conversion unit 21 for acquiring a captured image are started. On the other hand, in a case where exposure adjustment is not required, the drive signal OFG is not input, and a time corresponding to one V period becomes the exposure time of the photoelectric conversion unit 21.

In addition, the reference signal supplying unit 123 supplies a slope to the transistor 192 as the reference signal REF, and the counter 122 supplies a count signal BITXn to the transistor 221 through the output signal line 92. In this way, the acquisition of a reset level in the high-gain state is started.

Immediately after the start of the acquisition of a reset level, since the reference signal REF is higher than the voltage FD (electric potential), the voltage signal VCO is in the high level. For this reason, the transistor 221 is in the On state, and count signals BITXn are sequentially supplied to the parasitic capacitance C12 through the transistor 221 so as to be written therein.

Then, at time t3, when the reference signal REF approaches the voltage FD, and the voltage of the source/drain region of the transistor 196 decreases, the transistor 197 is turned on, and accordingly, the voltage applied to the gate electrode of the transistor 199 is raised. Then, the transistor 199 becomes the On state, and the voltage applied to the gate electrode of the transistor 197 is decreased. Accordingly, a positive feedback is applied, and the signal comparator 162 operates at a further higher speed.

Thereafter, when the reference signal REF becomes lower than the voltage FD, and the voltage signal VCO is inverted from the high level to the low level, the transistor 221 is turned off, and a state is formed in which the count signal BITXn is not supplied to the parasitic capacitance C12.

At this time, an AD-converted reset level in a high-gain state of electric charge (voltage) corresponding to the count signal BITXn maintained in the parasitic capacitance C12 of each data-latch circuit (hereinafter, referred to as a D-latch circuit) is formed. In other words, the voltage signal of the voltage FD that is an analog signal (analog value) representing the reset level is converted into a digital signal (digital value).

In addition, in a case where the voltage signal VCO is inverted to the low level, the transistor 194 is turned off, and accordingly, a current flows through the transistor 192 side (the transistor 195 side) of the differential amplifier 181. Then, as the amount of the current flowing through the PFB circuit 182 (the transistor 196 side), a current value limited according to a voltage Vb is limited to an amount copied according to a current mirror.

In other words, in the PFB circuit 182, before the inversion of the voltage signal VCO, only a current Ib determined according to the voltage Vb flows, and, after the current increases momentarily at the time of inversion, the current flowing through the PFB circuit 182 is settled down into a current limited according to a total of 2Ib. In this way, a mechanism can be realized which squeezes the current value Ib as possibly as can, supplies a current only at a time required for inverting the voltage signal VCO, and thereafter, squeezes the current. In other words, the signal comparator 162 operating at a high speed with low power consumption can be realized.

In addition, when the acquisition of a reset level ends, the voltage of the reference signal REF at time t4 is decreased up to a predetermined value, and the transistor 192 is turned off. By performing as such, a steady current within the differential amplifier 181 can be decreased.

At time t5, when the control signal WORD is set to the high level, and pixels 131 are selected in units of one row, the transistor 223 is turned on, a reset level of the high-gain state maintained in the parasitic capacitance C12 is read. In other words, the reset level is read by the reading circuit 125 through the output signal line 92 and is supplied to the signal processing unit 126. Then, the read reset level is stored in a frame memory disposed within the signal processing unit 126.

Note that, described in more detail, at the time of reading the reset level, after the output signal line 92 is precharged to high-level electric potential, a pixel row is selected according to the control signal WORD, and the transistor 223 is turned on. Then, in accordance with the electric charge maintained in the parasitic capacitance C12, the transistor 222 becomes the On state or is maintained to be in the Off state. Then, the electric potential of the output signal line 92 according to the state is detected by the reading circuit 125 and is read as the reset level.

More specifically, in a case where a signal of High (high level) is maintained in the parasitic capacitance C12, and the transistor 222 is turned on, a current flows through the output signal line 92, and the electric potential of the output signal line 92 becomes the low level. To the contrary, in a case where a signal of Low (low level) is maintained in the parasitic capacitance C12, and the transistor 222 is maintained to be turned off, a current does not flow through the output signal line 92, and accordingly, the electric potential of the output signal line 92 is maintained to be in the high level.

The reading circuit 125 detects such a change in the electric potential of the output signal line 92, thereby reading a reset level.

In addition, when the reset level of the pixels 131 that are in the selected state is read, thereafter, the control signal WORD is set to the low level, and the selection is released. The vertical drive circuit 124 sequentially selects each pixel row by using the control signal WORD and reads a reset level.

Next, at time t6, the drive signal TG1 is set to the high level, and the transfer transistor 171 is turned on, and the electric charge accumulated in the photoelectric conversion unit 21 is transferred to the electric charge/voltage converting unit 176.

At this time, the drive signal INI and the drive signal INI2 are set to the high level, the transistor 198 is turned off, and the transistor 200 is turned on, and the PFB circuit 182 is initialized. In addition, the level of the reference signal REF is raised up to a predetermined level. Here, the drive signal RST is maintained to be in the low level.

Thereafter, when the drive signal TG1 is set to the low level, the transfer transistor 171 is turned off, and the exposure period of the photoelectric conversion unit 21 (pixel 131) ends, at time t7, the drive signal INI2 is returned to the low level, and the initialization of the PFB circuit 182 ends. In addition, the drive signal INI is also set to the low level, and the transistor 200 is turned off.

In this way, after the end of the exposure period, when a state is formed in which electric charge transferred from the photoelectric conversion unit 21 is accumulated in the electric charge/voltage converting unit 176, at time t8, the reference signal supplying unit 123 decreases the reference signal REF to the determination level. Then, in the signal comparator 162, the reference signal REF is compared with the voltage FD, and it is determined whether to maintain the high gain or change the gain to the low gain.

In other words, in a case where the signal amount acquired by the photoelectric conversion unit 21 is small, and the voltage FD is higher (larger) than the reference signal REF, a voltage signal PFBO of the high level is acquired as a result of the comparison. In such a case, the high gain is maintained.

To the contrary, in a case where the signal amount acquired by the photoelectric conversion unit 21 is large, and the reference signal REF is higher than the voltage FD, a voltage signal PFBO of the low level is acquired as a result of the comparison. In such a case, switching to the low gain is performed.

In addition, when the reference signal REF and the voltage FD are compared with each other, at time t8, the control signal HGFIX is set to the low level such that a control signal Gain according to the result of the comparison is output.

At time t9, a drive signal GTR used for outputting a control signal Gain according to the result of the comparison is set to the high level. Accordingly, the switch 211 is turned on, and a voltage signal PFBO as the result of the comparison is input from the transistor 198 to the NOR gate 212. In other words, when the drive signal GTR is set to the high level, the voltage signal PFBO as the result of the comparison is received by the NOR gate 212.

The NOR gate 212 generates a control signal Gain on the basis of the voltage signal PFBO and the control signal HGFIX that have been input and outputs the generated control signal Gain. In addition, in this state, since the switch 214 is turned off, the control signal Gain output from the NOR gate 212 is not supplied to the gate electrode of the transistor 175 but is supplied only to the inverter 213.

In this way, when the determination of whether the conversion efficiency of the electric charge/voltage converting unit 176 is changed is performed, and the control signal Gain is generated, thereafter, the drive signal GTR is set to the low level.

Then, the switch 211 is turned off, and the NOR gate 212 and the PFB circuit 182 are electrically disconnected from each other. In addition, the switch 214 is turned on, and the control signal Gain output from the NOR gate 212 is supplied to the gate electrode of the transistor 175 through the switch 214.

At this time, since the drive signal GTR is set to the low level, the inverter 213 operates as well. In other words, the inverter 213 inverts the control signal Gain supplied from the NOR gate 212 and inputs the inverted control signal Gain to the NOR gate 212. In this case, the inverted control signal Gain input to the NOR gate 212 has the same level as that of the voltage signal PFBO received by the NOR gate 212 immediately before the disconnection of the NOR gate 212 from the PFB circuit 182, and accordingly, the control signal Gain output from the NOR gate 212 is not changed.

As above, when the determination of whether to change the conversion efficiency is performed, and the control signal Gain according to the result of the determination is supplied to the transistor 175, the transistor 175 is turned on or off in accordance with the control signal Gain, and the conversion efficiency of the electric charge/voltage converting unit 176 is appropriately changed.

For example, in a case where the voltage FD is higher than the reference signal REF, and the voltage signal PFBO is in the high level, the NOR gate 212 outputs a signal of the low level as the control signal Gain. In such a case, since the signal amount acquired by the photoelectric conversion unit 21 is small, electric charge overflowing from the photoelectric conversion unit 21 is not accumulated in the capacitor 174.

When the control signal Gain is in the low level, the transistor 175 is maintained to be in the Off state, and accordingly, the capacitor 174 is not connected to the electric charge/voltage converting unit 176, but the conversion efficiency of the electric charge/voltage converting unit 176 is maintained to be high, in other words, to be in the high-gain state.

In contrast to this, in a case where the reference signal REF is higher than the voltage FD, and the voltage signal PFBO is in the low level, the NOR gate 212 outputs a signal of the high level as the control signal Gain such that the conversion efficiency of the electric charge/voltage converting unit 176 is controlled to be changed.

In such a case, since the signal amount acquired by the photoelectric conversion unit 21 is large, electric charge overflowing from the photoelectric conversion unit 21 is accumulated in the capacitor 174. In other words, in the photoelectric conversion unit 21, signal electric charge generated over a saturated signal amount of the photoelectric conversion unit 21 overflows and is supplied to the capacitor 174 through the transistor 173 so as to be accumulated therein.

By performing as such, the electric charge (signal) read into the electric charge/voltage converting unit 176 at time t6 becomes a signal approaching the saturated signal amount of the photoelectric conversion unit 21, and the low gain is selected. In other words, the control signal Gain becomes the high level.

When the control signal Gain is in the high level, the transistor 175 becomes the On state, and the capacitor 174 is connected to the electric charge/voltage converting unit 176, and the conversion efficiency of the electric charge/ voltage converting unit 176 is changed to lower conversion efficiency. In other words, the state is changed to the low-gain state.

In a case where the conversion efficiency of the electric charge/voltage converting unit 176 is changed, and the capacitor 174 is connected to the electric charge/voltage converting unit 176, the electric charge accumulated in the capacitor 174 is also converted into a voltage, and accordingly, the electric charge (signal) acquired by the photoelectric conversion unit 21 can be read without being wasted.

In addition, in this case, since the capacitor 174 is added to the electric charge/voltage converting unit 176, when the conversion efficiency is changed to the low gain, the voltage FD is changed. However, even in a case where the voltage FD becomes higher than the reference signal REF, the NOR gate 212 and the PFB circuit 182 are electrically disconnected from each other, and accordingly, the control signal Gain is not inverted.

At time t10, the drive signal INI and the drive signal INI2 are set to the high level, the transistor 198 is turned off, and the transistor 200 is turned on, whereby the PFB circuit 182 is initialized. In addition, the level of the reference signal REF is also raised up to a predetermined level, and the supply of a slope is prepared.

Thereafter, the drive signal INI2 is returned to the low level, the transistor 198 is turned on, and the initialization of the PFB circuit 182 ends. In addition, at time t11, the drive signal INI is also set to the low level, and the transistor 200 is also turned off.

When the initialization ends, the reference signal supplying unit 123 supplies the slope to the transistor 192 as the reference signal REF, and the counter 122 supplies a count signal BITXn to the transistor 221 through the output signal line 92.

Accordingly, the acquisition of a signal level is started. At this time, a state is formed in which electric charge acquired by the photoelectric conversion unit 21 during the exposure period is accumulated in the electric charge/voltage converting unit 176 or the electric charge/voltage converting unit 176 and the capacitor 174 connected to the electric charge/voltage converting unit 176.

Immediately after the start of the acquisition of a signal level, the reference signal REF is higher (larger) than the voltage FD, and accordingly, the voltage signal VCO is in the high level. For this reason, the transistor 221 is in the On state, and count signals BITXn are sequentially supplied to the parasitic capacitance C12 through the transistor 221.

Thereafter, for example, at time t12, when the reference signal REF is lower (smaller) than the voltage FD, and the voltage signal VCO is inverted from the high level to the low level, the transistor 221 is turned off, and a state is formed in which the count signal BITXn is not supplied to the parasitic capacitance C12. At this time, electric charge (voltage) corresponding to the count signal BITXn maintained in the parasitic capacitance C12 of each D-latch circuit is in the AD-converted signal level. In other words, a voltage signal of the voltage FD that is an analog signal (analog value) representing the signal level is converted into a digital signal (digital value).

In addition, when the acquisition of a signal level ends, similarly to that at the time of acquisition of a reset level at time t13, the voltage of the reference signal REF is decreased up to a predetermined value, and the transistor 192 is turned off.

Then, at time t14, when the control signal WORD is set to the high level, and pixels 131 are selected in units of one row, similarly to that at the time of reading a reset level, the transistor 223 is turned on, and the signal level maintained in the parasitic capacitance C12 is read.

In other words, the signal level is read by the reading circuit 125 through the output signal line 92 and is supplied to the signal processing unit 126. Then, the read signal level is stored in the frame memory within the signal processing unit 126.

In addition, at the time of reading a signal level, a gain determination signal is read at the same time. The reading of a gain determination signal, similarly to the reading of a signal level, is performed after the output signal line 92 is precharged to the high-level electric potential.

In other words, when the transistor 216 is turned on in accordance with the control signal WORD, the transistor 215 becomes the On state or is maintained to be in the Off state in accordance with the inverted control signal Gain that is the output of the inverter 213. The reading circuit 125 reads a gain determination signal by detecting the electric potential of the output signal line 92 that is determined according the On/Off state of the transistor 215 and supplies the read gain determination signal to the signal processing unit 126.

In a case where the gain determination signal is a signal representing the high gain, the signal processing unit 126 reads a reset level and a signal level from the frame memory, acquires a difference between the reset level and the signal level, and sets the acquired value as a value of a pixel signal (a signal of correlated double sampling (CDS)) that is a digital signal. In addition, the calculated value of the pixel signal is supplied to the frame memory so as to be stored therein.

In contrast to this, in a case where the gain determination signal is a signal representing the low gain, the signal processing unit 126 reads a reset level and a signal level from the frame memory, discards the reset level, and writes back the signal level into the frame memory.

The vertical drive circuit 124 sequentially selects each pixel row by using the control signal WORD and reads a signal level and a gain determination signal.

Next, in order to acquire a reset level in the low-gain state, the drive signal RST at time t15 is set to the high level, the reset transistor 178 is turned on, and the electric charge/voltage converting unit 176 and the differential amplifier 181 are initialized to a predetermined voltage. In addition, the drive signal INI and the drive signal INI2 are set to the high level, the transistor 198 is turned off, and the transistor 200 is turned on, whereby the PFB circuit 182 is initialized.

Thereafter, the initialization is released by returning the drive signal RST and the drive signal INI2 to the low level, and the drive signal INI is returned to the low level at time t16. In addition, at this time, the level of the reference signal REF is raised up to a predetermined level, and the supply of a slope is prepared.

In this state, when the gain determination signal is a signal representing the low gain, the capacitor 174 is in a state of being maintained to be connected to the electric charge/voltage converting unit 176, in other words, the low-gain state.

Subsequently, the reference signal supplying unit 123 supplies the slope to the transistor 192 as the reference signal REF, and the counter 122 supplies a count signal BITXn to the transistor 221 through the output signal line 92. Accordingly, the acquisition of a reset level in the low-gain state is started. At the time of acquisition of a reset level of the low gain, an operation similar to that at the time of the acquisition of a reset level of the high gain is performed.

In other words, immediately after the start of the acquisition of a reset level, since the reference signal REF is higher (larger) than the voltage FD, and the voltage signal VCO is in the high level, the count signal BITXn is supplied to the parasitic capacitance C12.

Thereafter, when the reference signal REF is lower (smaller) than the voltage FD at the t17, and the voltage signal VCO is inverted from the high level to the low level, the transistor 221 is turned off, and a state is formed in which the count signal BITXn is not supplied to the parasitic capacitance C12. At this time, electric charge (voltage) corresponding to the count signal BITXn maintained in the parasitic capacitance C12 of each D-latch circuit becomes the AD-converted reset level in the low gain. In other words, the voltage signal of the voltage FD that is an analog signal (analog value) representing the reset level is converted into a digital signal (digital value).

In addition, when the acquisition of a reset level ends, the voltage of the reference signal REF is decreased up to a predetermined value, and the transistor 192 is turned off.

Then, when the control signal WORD is set to the high level at time t18, and the pixels 131 are selected in units of one row, similarly to that at the time of reading a reset level of the high gain, the transistor 223 is turned on, and the reset level maintained in the parasitic capacitance C12 is read.

In other words, the reset level is read by the reading circuit 125 through the output signal line 92 and is supplied to the signal processing unit 126. Then, the read reset level is stored in the frame memory within the signal processing unit 126.

In a case where the gain determination signal read at time t14 is a signal representing the low gain, the signal processing unit 126 reads a reset level and a signal level from the frame memory, acquires a difference between the reset level and the signal level, and sets the acquired value as the value of the pixel signal (a signal of double data sampling (DDS)). Then, the signal processing unit 126 outputs the value of the pixel signal that is an acquired digital signal to the outside through the input/output unit 127.

In contrast to this, in a case where the gain determination signal is a signal representing the high gain, the signal processing unit 126 outputs the value of the pixel signal that has already been stored in the frame memory to the outside through the input/output unit 127.

The vertical drive circuit 124 sequentially selects each pixel row by using the control signal WORD and reads a reset level.

In this way, when all the pixel rows are selected, and the pixel signals of all the pixels of the pixel array unit 121 are acquired, an image signal of a captured image formed from such pixel signals of the pixels is acquired. When a captured image as a still image or a captured image corresponding to one frame as a moving image is acquired, the imaging process ends. In addition, in a case where the captured image is a moving image, after a captured image corresponding to one frame is acquired, the imaging of a next frame is started.

As above, the solid-state imaging device 51 compares the reference signal REF with the voltage FD of the electric charge/voltage converting unit 176 for each pixel 131 and adaptively changes the conversion efficiency of the pixel 131 in accordance with a result of the comparison after the exposure period and before the acquisition of a signal level.

In this way, optimal conversion efficiency can be set for each pixel 131 in accordance with the high gain (low illuminance) or the low gain (high illuminance), and a captured image of high quality in which underexposure and overexposure are suppressed can be acquired. In addition, by adaptively changing the conversion efficiency, the number of times of the acquisition of a signal level and the reading can be set as one, and accordingly, a captured image can be more quickly acquired.

In addition, since the solid-state imaging device 51 also performs an AD conversion for each pixel 131 by using the signal comparator 162 used for changing the conversion efficiency, the AD conversion can be simultaneously performed in all the pixels 131, and a global shutter function can be realized.

In addition, in the pixel 131 illustrated in FIG. 5, while an example has been described in which the switching of the conversion efficiency has two patterns (two stages) of the low gain and the high gain, also in a case where switching among three patterns or more is performed, an image signal of a captured image can be acquired by a driving operation similar to that of the case of the two patterns.

In such a case, it may be configured such that, by operating a state of a highest gain (high conversion efficiency) as an initial value, a pixel signal is acquired using the CDS, and a pixel signal is acquired using the DDS for the other low gains. At the time of acquiring a pixel signal using the CDS, a kTC noise (reset noise) can be eliminated, and, at the time of acquiring a pixel signal using the DDS, the signal amount is sufficient, and the kTC noise can ignored. The switching between the CDS and the DDS, in other words, the determination level described above, for example, is preferably a place at which the S/N ratio of 32 dB or more is present.

Modified Example 2 of First Embodiment

<Example of Configuration of Pixel>

In addition, in the pixel 61 illustrated in FIG. 2, analog signals representing a reset level and a signal level, which are acquired by the electric charge/voltage converting unit 23, and a gain determination signal that is a digital signal may be configured to be output to the outside.

Figure 7:
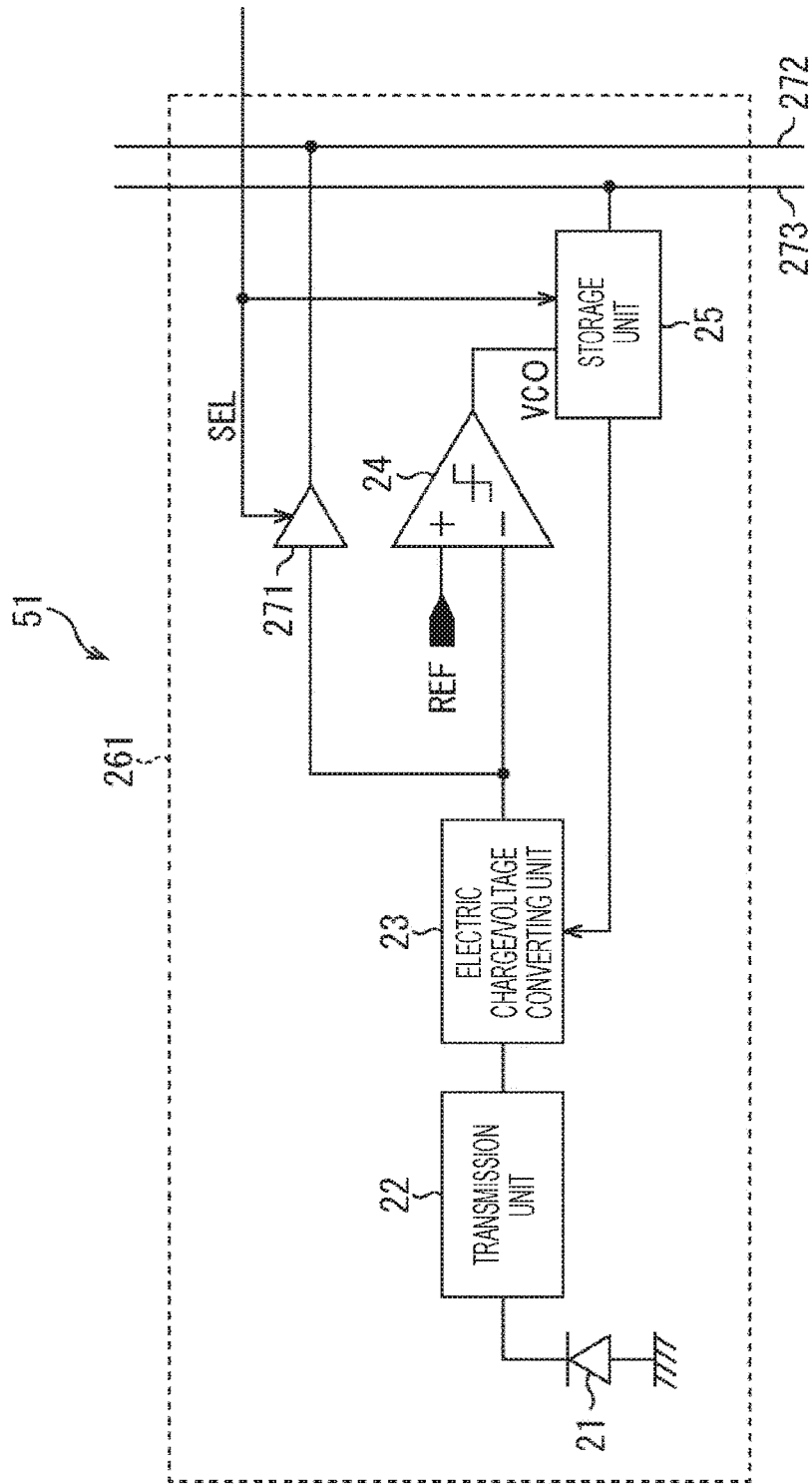
FIG. 7 is a diagram that illustrates an example of the configuration of a pixel of a solid-state imaging device.

In such a case, the pixel of the solid-state imaging device 51, for example, is configured as illustrated in FIG. 7. Note that, in FIG. 7, a same reference numeral is assigned to a part corresponding to that of the case illustrated in FIG. 2, and the description thereof will not be presented as is appropriate.

In the example illustrated in FIG. 7, a pixel 261 includes a photoelectric conversion unit 21, a transmission unit 22, an electric charge/voltage converting unit 23, a signal comparator 24, a storage unit 25, and an output circuit 271.

In the pixel 261 illustrated in FIG. 7, a vertical signal line 272 is connected to the output circuit 271, and a current source that is not illustrated in the drawing is connected to this vertical signal line 272 so as to configure a source follower.

When the output circuit 271 is selected according to a control signal SEL supplied from the outside, the output circuit 271 outputs an analog signal (analog value) corresponding to a voltage signal supplied from the electric charge/voltage converting unit 23 to the vertical signal line 272 as a signal representing a reset level or a signal level.

Here, the output of the analog value of a signal level and the output of the analog value of a reset level for each conversion efficiency, for example, may be performed using driving and timing similar to those of the case described with reference to FIG. 6.

The storage unit 25 stores a control signal Gain acquired from a result of a comparison supplied from the signal comparator 24 and also stores a gain determination signal acquired using the control signal Gain. In addition, the storage unit 25 is connected to an output signal line 273. Thus, when the storage unit 25 is selected according to a control signal SEL supplied from the outside, the storage unit 25 outputs the stored gain determination signal to the output signal line 273. The gain determination signal output at this time is a signal that represents conversion efficiency after a conversion as is necessary.

<Example of Configuration of Solid-State Imaging Device>

Figure 8:
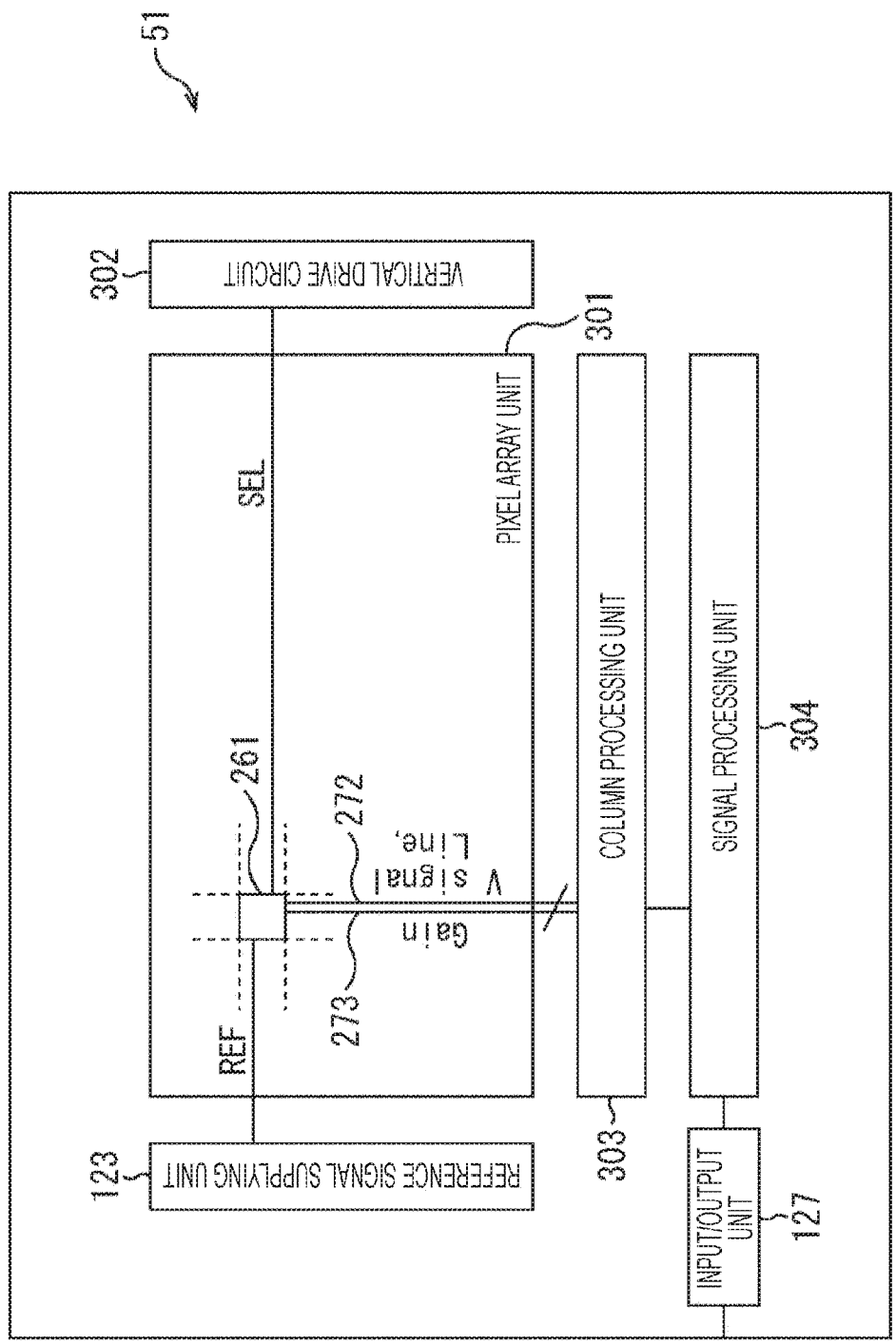
FIG. 8 is a diagram that illustrates an example of the configuration of a solid-state imaging device.

In addition, the solid-state imaging device 51 including the pixel 261 illustrated in FIG. 7, for example, may have a configuration illustrated in FIG. 8. Note that, in FIG. 8, a same reference numeral is assigned to a part corresponding to that of the case illustrated in FIG. 7 or FIG. 4, and the description thereof will not be presented as is appropriate.

In the solid-state imaging device 51 illustrated in FIG. 8, a pixel array unit 301, a reference signal supplying unit 123, a vertical drive circuit 302, a column processing unit 303, a signal processing unit 304, and an input/output unit 127 are disposed on one chip.

In the pixel array unit 301, a plurality of pixels 261 illustrated in FIG. 7 are arranged. Note that, in FIG. 8, while only one pixel 261 is illustrated in the pixel array unit 301, actually, the plurality of pixels 261 are disposed.

Each pixel 261 disposed in the pixel array unit 301 is connected to the column processing unit 303 using the vertical signal line 272 and the output signal line 273, and, for example, a plurality of pixels 261 aligned in the vertical direction in the drawing, in other words, in a column direction (vertical direction) are connected to one vertical signal line 272 or one output signal line 273.

In addition, a plurality of pixels 261 aligned in the horizontal direction in the drawing, in other words, a row direction (horizontal direction) are connected to the reference signal supplying unit 123 through a control line that is long in the horizontal direction. In addition, the plurality of pixels 261 aligned in the row direction are connected also to the vertical drive circuit 302 through another control line that is long in the horizontal direction.

The reference signal supplying unit 123 supplies a reference signal REF to the signal comparator 24 of each pixel 261. In this example, since an AD conversion is not performed in the signal comparator 24, only the reference signal REF of a determination level is supplied to the signal comparator 24 as is necessary. In other words, the supply of a slope is not performed.

By supplying the control signal SEL to the output circuit 271 and the storage unit 25 of the pixel 261 through control lines, the vertical drive circuit 302 selects pixels 261 in units of one row.

The column processing unit 303 performs AD conversions of a reset level and a signal level that are analog signals supplied from the output circuit 271 of the pixel 261 through the vertical signal line 272.

In addition, the column processing unit 303, on the basis of a gain determination signal supplied from the storage unit 25 of the pixel 261 through the output signal line 273, acquires a difference between the reset level and the signal level for which the AD conversions have been performed, calculates a pixel signal that is a digital signal using the CDS or the DDS, and supplies the calculated pixel signal to the signal processing unit 304.

The signal processing unit 304, for an image signal of a captured image formed by a pixel signal of each pixel 261 that is supplied from the column processing unit 303, for example, performs various image processing such as black level adjustment, demosaic, and the like and supplies a resultant signal to the input/output unit 127.

In a case where the solid-state imaging device 51 has the configuration illustrated in FIG. 8, and AD conversions of a reset level and a signal level are performed using the column processing unit 303 disposed outside the pixel 261, the AD conversions cannot be performed together for all the pixels 261. For this reason, imaging is performed using not a global shutter but a rolling shutter.

Note that, as an AD conversion circuit configuring the column processing unit 303, while a circuit of a single slope type has a small area and enables a decrease in the size of the column processing unit 303, other than that, various kinds of circuits such as a cyclic type, a two-stage cyclic type, a pipeline type, a sequential comparison type, and the like may be used. In addition, in the pixel 261, it may be configured such that short circuit of the input and the output of the signal comparator 24 is formed as a configuration of an operational amplifier so as to be formed as a buffer having a unity gain, and the buffer of the unity gain is used instead of the output circuit 271 configuring a source follower circuit.

Modified Example 3 of First Embodiment

<Example of Configuration of Pixel>

Furthermore, by disposing an analog memory used for maintaining electric charge in the pixel configuration of analog reading illustrated in FIG. 7, a global shutter function may be realized.

For example, as in the case of the pixel 131 illustrated in FIG. 5, by performing an AD conversion by using the signal comparator 162 within each pixel 131 in all the pixels 131 at the same time, the global shutter function can be realized.

However, in a case where the column processing unit 303 reads an analog signal representing a reset level or a signal level from the pixel 261 as in the case of the pixel 261 illustrated in FIG. 7, pixel rows are sequentially scanned (selected), and accordingly, the global shutter function cannot be realized.

Thus, by disposing an analog memory used for maintaining electric charge within the pixel 261 and transmitting signals from all the pixels 261 to the analog memory at the same time, the global shutter function and an adaptive change in the conversion efficiency may be realized.

Figure 9:
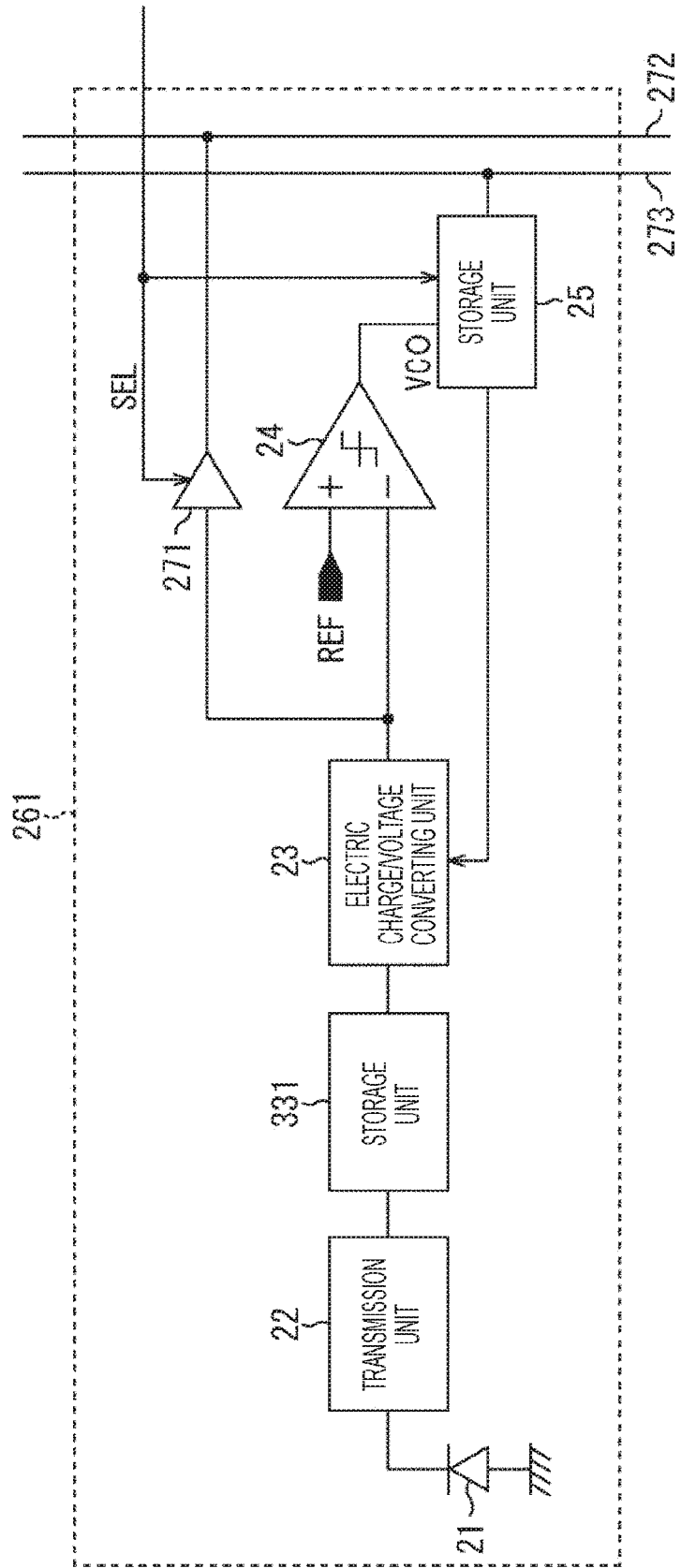
FIG. 9 is a diagram that illustrates an example of the configuration of a pixel of a solid-state imaging device.

In such a case, the pixel 261 of the solid-state imaging device 51 illustrated in FIG. 8, for example, is configured as illustrated in FIG. 9. Note that, in FIG. 9, a same reference numeral is assigned to a part corresponding to that of the case illustrated in FIG. 7, and the description thereof will not be presented as is appropriate.

The pixel 261 illustrated in FIG. 9 includes a photoelectric conversion unit 21, a transmission unit 22, an electric charge/voltage converting unit 23, a signal comparator 24, a storage unit 25, an output circuit 271, and a storage unit 331.

In the configuration of the pixel 261 illustrated in FIG. 9, the storage unit 331 is disposed between the transmission unit 22 and the electric charge/voltage converting unit 23, which is different from the configuration of the pixel 261 illustrated in FIG. 7, and the configuration is the same as that of the pixel 261 illustrated in FIG. 7 in the other points.

The storage unit 331 is an analog memory, temporarily maintains electric charge supplied from the photoelectric conversion unit 21 through the transmission unit 22, and supplies the maintained electric charge to the electric charge/voltage converting unit 23. In this way, by disposing the storage unit 331 that temporarily maintains electric charge between the photoelectric conversion unit 21 and the electric charge/voltage converting unit 23, the global shutter function and an adaptive change in the conversion efficiency can be realized.

Second Embodiment

<Example of Configuration of Solid-State Imaging Device>

Note that, while an example has been described as above in which the signal comparator used for changing the conversion efficiency of the electric charge/voltage converting unit is disposed within the pixel, the signal comparator may be disposed outside the pixel.

Figure 10:
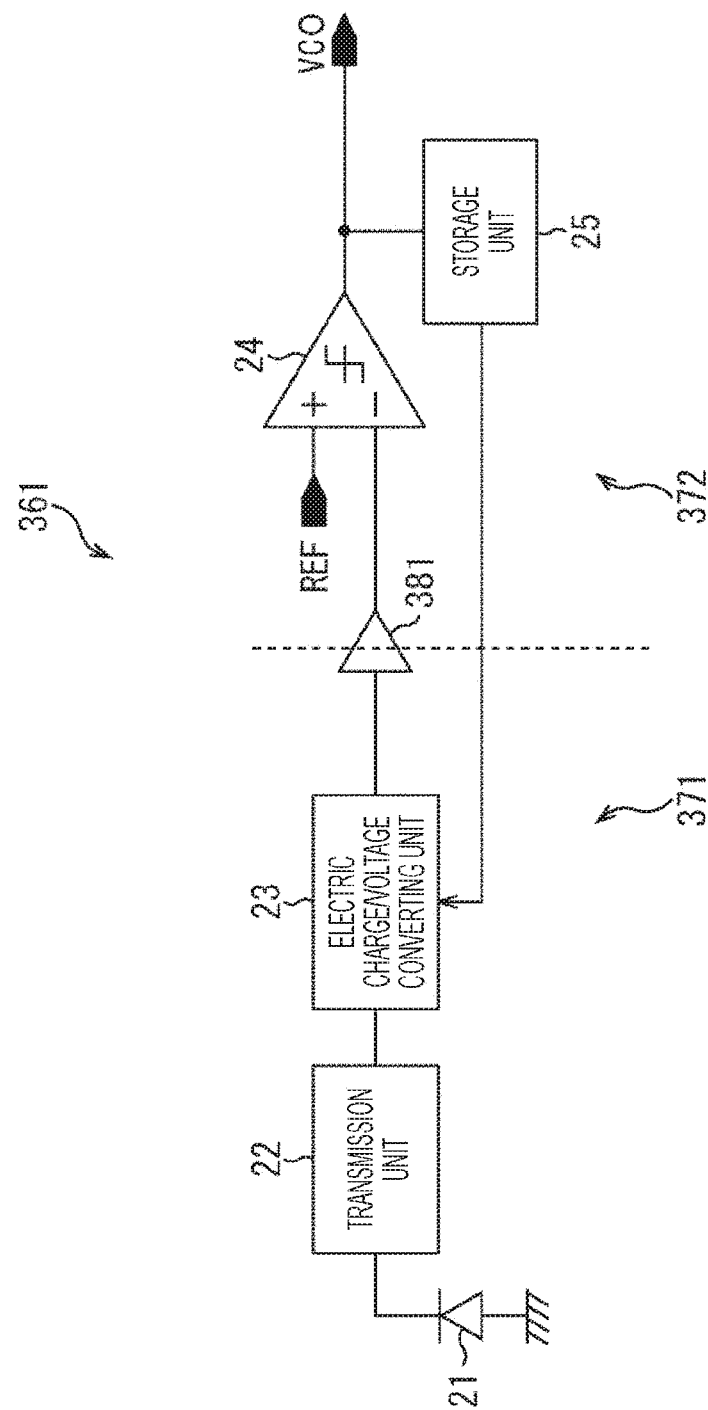
FIG. 10 is a diagram that illustrates an example of the configuration of a solid-state imaging device.

In such a case, in a solid-state imaging device according to the present technology, for example, as illustrated in FIG. 10, a signal comparator is disposed in a column processing unit outside the pixel. Note that, in FIG. 10, a same reference numeral is assigned to a part corresponding to that of the case illustrated in FIG. 1, and the description thereof will not be presented as is appropriate.

A solid-state imaging device 361 illustrated in FIG. 10 includes a pixel 371 and a column processing unit 372. Here, elements disposed to the left side of a dotted line disposed in the vertical direction in the drawing represent elements disposed within the pixel 371, and elements disposed to the right side of the dotted line disposed in the vertical direction in the drawing represent elements disposed within the column processing unit 372. Note that, described in more detail, in the solid-state imaging device 361, a plurality of the pixels 371 are disposed.

In the pixel 371, a photoelectric conversion unit 21, a transmission unit 22, an electric charge/voltage converting unit 23, and a part of circuits configuring a source follower circuit 381 are disposed. In addition, in the column processing unit 372, a part of circuits configuring the source follower circuit 381, a signal comparator 24, and a storage unit 25 are disposed.

In the solid-state imaging device 361, by using the source follower circuit 381, source follower reading of a voltage signal acquired by the electric charge/voltage converting unit 23 is performed, and the read voltage signal is supplied to the signal comparator 24.

When a slope as a reference signal REF is supplied, the signal comparator 24 compares a voltage signal supplied from the source follower circuit 381, in other words, an analog signal representing a reset level or a signal level with the reference signal REF. Then, on the basis of a result of the comparison, an AD conversion is performed.

In addition, in a case where the reference signal REF of a determination level is supplied, the signal comparator 24 compares a voltage signal supplied from the source follower circuit 381 with the reference signal REF. Then, on the basis of a result of the comparison, the conversion efficiency is adaptively switched.

In this way, in the solid-state imaging device 361, the signal comparator 24 used for an AD conversion is used, and the switching of the conversion efficiency is controlled outside the pixel 371.

<Example of Specific Configuration of Solid-State Imaging Device>

Subsequently, as described with reference to FIG. 10, a more specific embodiment of the solid-state imaging device 361 in which the signal comparator 24 is disposed in the column processing unit 372 outside the pixel 371 will be described.

Figure 11:
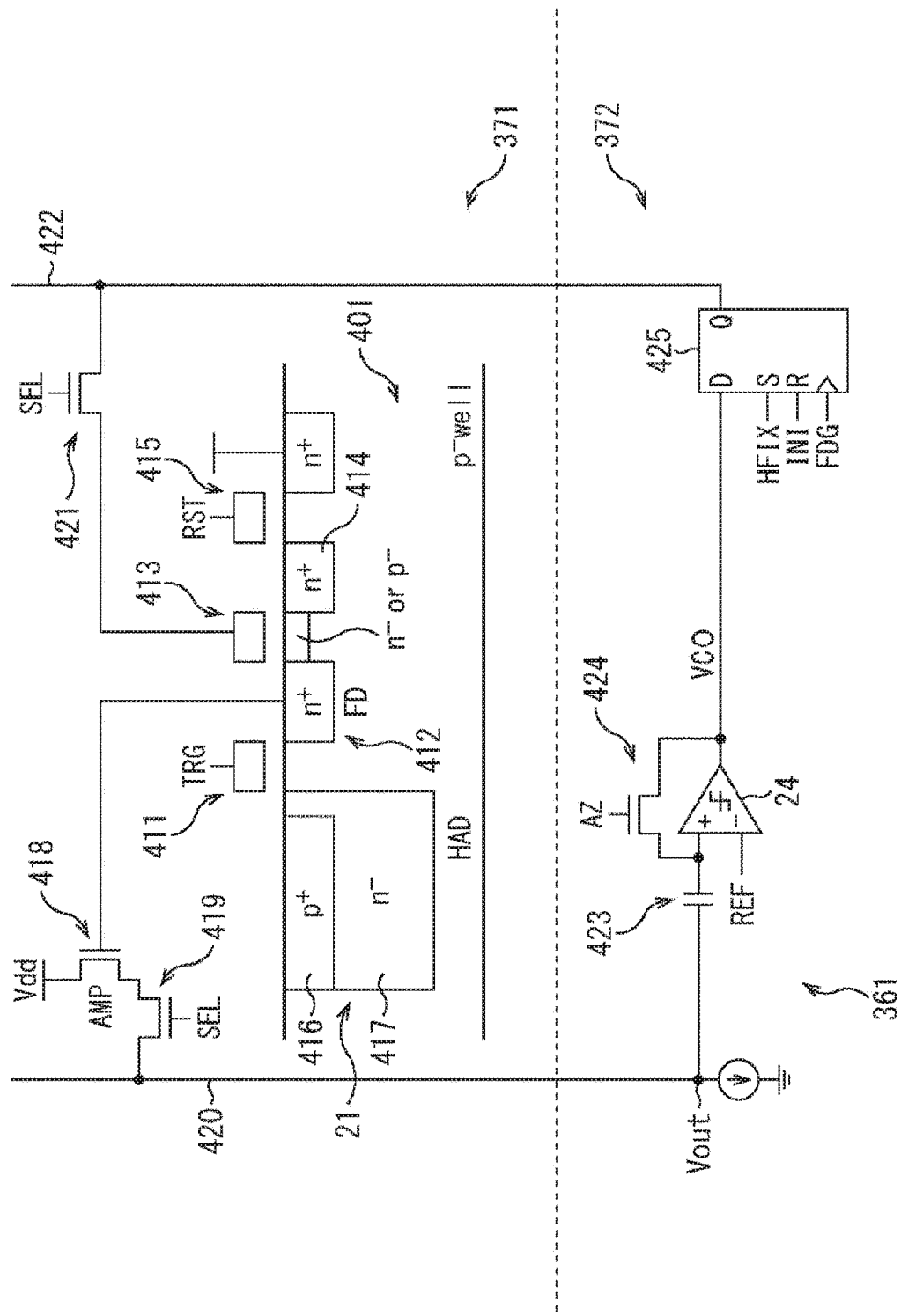
FIG. 11 is a diagram that illustrates an example of the configuration of a solid-state imaging device.

FIG. 11 is a diagram that illustrates an example of the specific configuration of the solid-state imaging device 361. In addition, in FIG. 11, a same reference numeral is assigned to a part corresponding to that of the case illustrated in FIG. 10, and the description thereof will not be presented as is appropriate.

In FIG. 11, the upper side and the lower side of a dotted line disposed in the horizontal direction in the drawing are respectively the pixel 371 and the column processing unit 372.

In the pixel 371, a photoelectric conversion unit 21, a transfer transistor 411, an electric charge/voltage converting unit 412, a transistor 413, a capacitor 414, and a reset transistor 415 are disposed in a p-type well 401 on a semiconductor substrate.

The photoelectric conversion unit 21 is formed by a p+ type semiconductor region 416 and an n− type semiconductor region 417 disposed inside the p-type well 401, performs a photoelectric conversion of incident light, and accumulates electric charge acquired as a result thereof. In addition, when a drive signal TRG supplied to a gate electrode becomes the high level, the transfer transistor 411 disposed between the photoelectric conversion unit 21 and the electric charge/voltage converting unit 412 is in a conductive state (On state) and transfers electric charge accumulated in the photoelectric conversion unit 21 to the electric charge/voltage converting unit 412. The transfer transistor 411 corresponds to the transmission unit 22 illustrated in FIG. 10.

The electric charge/voltage converting unit 412 is a floating diffusion region formed by the n+ type semiconductor region disposed inside the p-type well 401, accumulates electric charge supplied from the photoelectric conversion unit 21 through the transfer transistor 411, and converts the accumulated electric charge into a voltage signal. The gate electrode of the amplification transistor 418 is connected to the electric charge/voltage converting unit 412.

In addition, the amplification transistor 418 has a drain connected to a power supply of a predetermined voltage Vdd and is an input unit of a source follower circuit that reads the electric charge (voltage signal) accumulated in the electric charge/voltage converting unit 412. In other words, the amplification transistor 418 has a source connected to a vertical signal line 420 through a selection transistor 419, thereby configuring a constant current source and a source follower circuit that are connected to one end of the vertical signal line 420. The source follower circuit configured in this way corresponds to the source follower circuit 381 illustrated in FIG. 10.

The selection transistor 419 is connected between the source of the amplification transistor 418 and the vertical signal line 420. When a control signal SEL supplied to a gate electrode becomes the high level, the selection transistor 419 is in the On state, in other words, a conductive state and supplies a voltage signal output from the amplification transistor 418 to the column processing unit 372 through the vertical signal line 420.

The amplification transistor 418 and the selection transistor 419 are disposed within the pixel 371.

The transistor 413 is formed by a p− type semiconductor region or an n− type semiconductor region disposed between the electric charge/voltage converting unit 412 and the capacitor 414 inside the p-type well 401 and a gate electrode connected to the transistor 421. When a control signal Gain supplied to the gate electrode becomes the high level, the transistor 413 is in the conductive state (On state) and electrically connects the electric charge/voltage converting unit 412 and the capacitor 414.

The capacitor 414 is formed by an n+ type semiconductor region and accumulates apart of electric charge transferred to the electric charge/voltage converting unit 412 when being electrically connected to the electric charge/voltage converting unit 412. In addition, the capacitor 414 is initialized when a drive signal RST supplied to the gate electrode of the reset transistor 415 becomes the high level, and the reset transistor 415 is turned on.

In the example illustrated in FIG. 11, the electric charge/voltage converting unit 412 corresponds to the electric charge/voltage converting unit 23 illustrated in FIG. 10, and the conversion efficiency of the electric charge/voltage converting unit 412 is changed as the capacitor 414 is connected to the electric charge/voltage converting unit 412.

The transistor 421 is disposed within the pixel 371. When a control signal SEL supplied to the gate electrode becomes the high level, the transistor 421 is in the On state, in other words, the conductive state and supplies a control signal Gain supplied from the column processing unit 372 through a control line 422 to the transistor 413.

In addition, the column processing unit 372 includes a capacitor 423, a transistor 424, a signal comparator 24, and a D-FF circuit 425.

The capacitor 423 is disposed between the vertical signal line 420 and an input-side terminal of the signal comparator 24 and cuts a DC component of a voltage signal supplied from the vertical signal line 420 to the signal comparator 24. The transistor 424 is connected to an input terminal and an output terminal of the signal comparator 24 and is in the On state (conductive state) when a drive signal AZ supplied to the gate electrode of the transistor 424 becomes the high level. When the transistor 424 is turned on, auto zero that is a voltage level serving as the reference is acquired by the signal comparator 24.

The D-FF circuit 425 is a D-type flip-flop circuit disposed between the output terminal of the signal comparator 24 and the control line 422 and corresponds to the storage unit 25 illustrated in FIG. 10. An input terminal D of the D-FF circuit 425 is connected to the signal comparator 24, and an output terminal Q of the D-FF circuit 425 is connected to the control line 422.

The D-FF circuit 425 latches (acquires) a voltage signal VCO supplied from the signal comparator 24 in accordance with a sample pulse FDG supplied from the outside and outputs the latched voltage signal to the control line 422 as a control signal Gain. In addition, when an enforcing setting signal HFIX of the high level is supplied to an input terminal S of the D-FF circuit 425, the control signal Gain output from the D-FF circuit 425 is fixed to the high level, and, when an initialization signal INI of the high level is supplied to an input terminal R of the D-FF circuit 425, the control signal Gain output from the D-FF circuit 425 is initialized to the low level.

In addition, an up-down counter that is not illustrated in the drawing is connected to the signal comparator 24. The up-down counter counts a time until the voltage signal VCO supplied from the signal comparator 24 is inverted and acquires a digital value of a pixel signal from a result of the count.

Next, the operation of the solid-state imaging device 361 illustrated in FIG. 11 will be described.

First, an initialization signal INI of the high level is supplied to the input terminal R of the D-FF circuit 425, and the control signal Gain is fixed to the low level.

In addition, the control signal SEL is set to the high level, and the transistor 421 and the selection transistor 419 become the On state. Since the control signal Gain is the low level, the transistor 413 is in the Off state. The electric charge/voltage converting unit 412 and the capacitor 414 are electrically separate from each other. In other words, a high-gain state is formed.

Next, in such a state, a drive signal AZ supplied to the transistor 424 is set to the high level, and auto zero is acquired. Then, a slope as the reference signal REF is supplied to the signal comparator 24, and a reset level is acquired. In other words, a time until the voltage signal VCO supplied from the signal comparator 24 is inverted is down-counted by the up-down counter not illustrated in the drawing and is stored in an internal memory. A result of the count acquired in this way is the digital value of the reset level of the high gain.

Thereafter, an enforced setting signal HFIX of the high level is supplied to the input terminal S of the D-FF circuit 425, and the control signal Gain is fixed to the high level. Then, the transistor 413 becomes the On state, and the electric charge/voltage converting unit 412 and the capacitor 414 are electrically connected to each other. In other words, a low-gain state is formed.

In this state, a slope as the reference signal REF is supplied to the signal comparator 24, and a reset level is acquired. In other words, in the up-down counter that is not illustrated in the drawing, similarly to the case at the time of acquiring a reset level of the high gain, a reset level of the low gain is acquired and is stored in an internal memory.

Subsequently, again, an initialization signal INI of the high level is supplied to the input terminal R of the D-FF circuit 425, and the control signal Gain is set to the low level. Accordingly, the transistor 413 becomes the Off state, and the electric charge/voltage converting unit 412 and the capacitor 414 are electrically disconnected from each other. In other words, the high-gain state is formed from the low-gain state.

Then, a drive signal TRG of the high level is supplied to the transfer transistor 411, the transfer transistor 411 becomes On, and electric charge acquired by the photoelectric conversion unit 21 until now is transferred to the electric charge/voltage converting unit 412.

In addition, immediately after the transfer of electric charge from the photoelectric conversion unit 21 to the electric charge/voltage converting unit 412, in more detail, during the transfer, the voltage of the reference signal REF is set to the determination level, and, during the reading of a voltage signal corresponding to the electric charge transferred to the photoelectric conversion unit 21, in other words, during the settling of a voltage signal read by the vertical signal line 420, a sample pulse FDG of a pulse shape is input to the D-FF circuit 425.

Then, in the signal comparator 24, the reference signal REF set to the determination level during the settling and the voltage signal, which is acquired by the electric charge/voltage converting unit 412, and read through the vertical signal line 420 are compared with each other, and a voltage signal VCO representing a result of the comparison is received by the D-FF circuit 425.

At this time, in a case where a pixel output at the time of inputting the sample pulse FDG, in other words, the voltage signal acquired by the electric charge/voltage converting unit 412 is higher (the signal amount is smaller) than the determination level, the voltage signal VCO becomes the low level. In this case, since the control signal Gain output from the D-FF circuit 425 is also in the low level, the capacitor 414 and the electric charge/voltage converting unit 412 are maintained to be disconnected from each other, in other words, the high-gain state is maintained.

In contrast to this, in a case where the voltage signal acquired at the time of inputting the sample pulse FDG by the electric charge/voltage converting unit 412 is lower (the signal amount is larger) than the determination level, the voltage signal VCO becomes the high level. In this case, since the control signal Gain output from the D-FF circuit 425 becomes the high level, the capacitor 414 and the electric charge/voltage converting unit 412 are connected to each other, and a voltage signal acquired by the electric charge/voltage converting unit 412 in the low-gain state is read. In other words, during the reading of a signal level, in other words, before the completion of the reading of a signal level, the gain is switched from the high gain to the low gain.

In this way, as is appropriate, in a case where the gain (conversion efficiency) is changed, and a voltage signal acquired by the electric charge/voltage converting unit 412 is read, thereafter, similarly to the case at the time of acquiring a reset level, a signal level is acquired.

In other words, in the up-down counter that is not illustrated in the drawing, a reset level specified according to the control signal Gain is read from an internal memory is set in the counter. More specifically, when the control signal Gain is in the high level, a reset level of the low gain is read. On the other hand, when the control signal Gain is in the low level, a reset level of the high gain is read.

Then, a slope as the reference signal REF is supplied to the signal comparator 24, and, in the up-down counter that is not illustrated in the drawing, by using a counter to which the reset level is set, a time until the inversion of the voltage signal VCO supplied from the signal comparator 24 is up-counted. A result of the count acquired in this way is the digital value of a pixel signal acquired according to a difference between the reset level and the signal level. In other words, in this example, the calculation of a pixel signal is also performed simultaneously with the reading of a signal level.

As above, also by adaptively changing the conversion efficiency simultaneously with the start of reading a signal level, a high-quality captured image can be acquired more quickly.

Modified Example 1 of Second Embodiment

<Example of Configuration of Solid-State Imaging Device>

In addition, the configuration of the solid-state imaging device 361 illustrated in FIG. 11 assumes a case where the settling of a voltage signal read by the vertical signal line 420 is after the input of the sample pulse FDG, there are other cases. Thus, by considering such cases as well, the part of the D-FF circuit 425 may be configured in two stages, and timing at which data (voltage signal) is taken in and timing at which the setting is reflected may be configured to be controllable.

Figure 12:
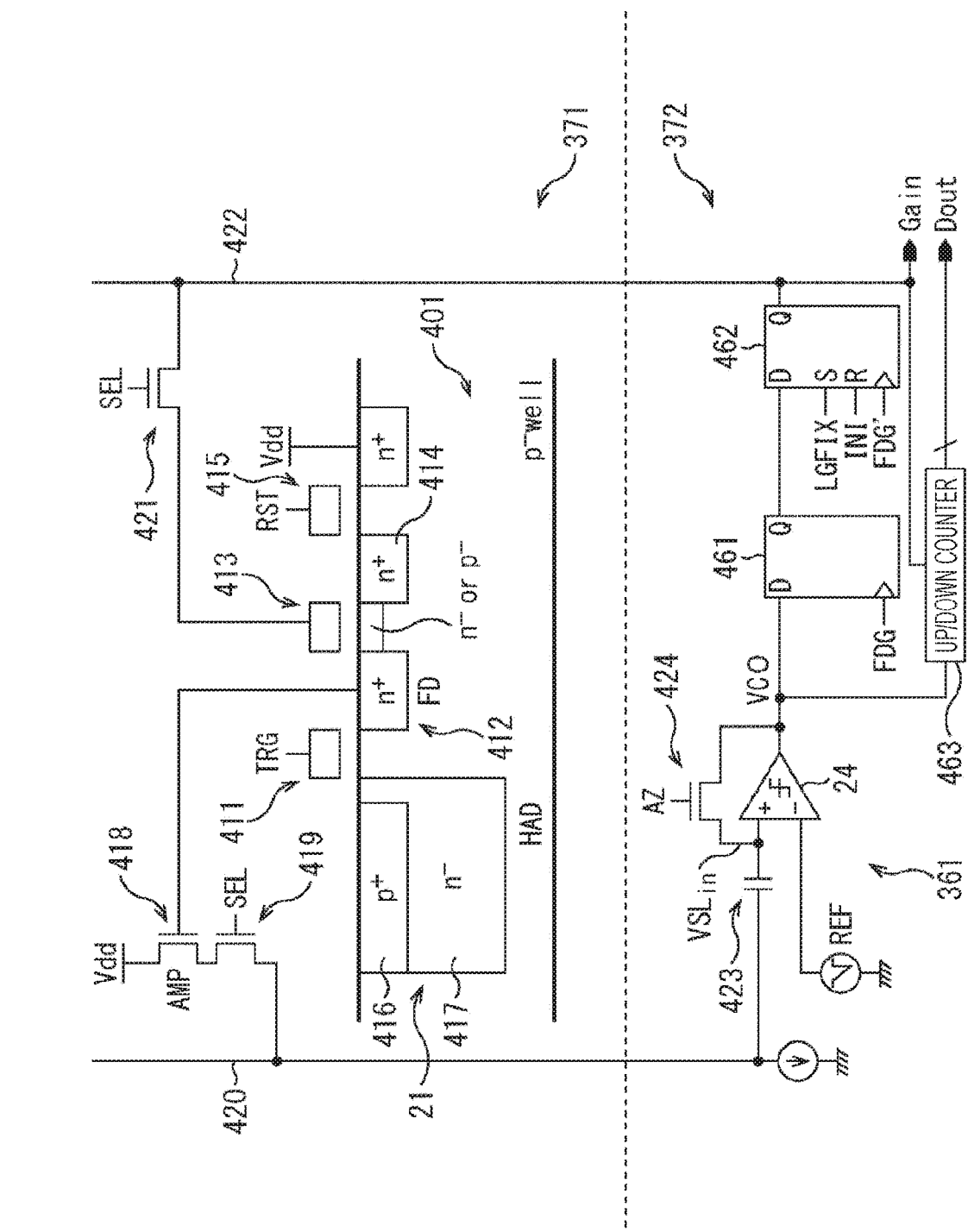
FIG. 12 is a diagram that illustrates an example of the configuration of a solid-state imaging device.

In a case where the timing at which data is taken in and the timing at which the setting is reflected are configured to be controllable, the solid-state imaging device 361, for example, is configured as illustrated in FIG. 12. In addition, in FIG. 12, a same reference numeral is assigned to a part corresponding to that of the case illustrated in FIG. 11, and the description thereof will not be presented as is appropriate.

In the solid-state imaging device 361 illustrated in FIG. 12, the configuration of the part of a pixel 371 is the same as the configuration of the part of the pixel 371 of the solid-state imaging device 361 illustrated in FIG. 11.

In addition, in the configuration of the column processing unit 372 of the solid-state imaging device 361 illustrated in FIG. 12, instead of the D-FF circuit 425 of the column processing unit 372 of the solid-state imaging device 361 illustrated in FIG. 11, a D-FF circuit 461 and a D-FF circuit 462 are disposed, which is different from the column processing unit 372 illustrated in FIG. 11. In addition, in a column processing unit 372 illustrated in FIG. 12, an up-down counter 463 that is omitted in FIG. 11 is also disposed.

The D-FF circuit 461 is a D-type flip-flop circuit disposed between the signal comparator 24 and the D-FF circuit 462. An input terminal D of the D-FF circuit 461 is connected to an output terminal of the signal comparator 24, and an output terminal Q of the D-FF circuit 461 is connected to an input terminal D of the D-FF circuit 462. The D-FF circuit 461 latches (acquires) a voltage signal VCO supplied from the signal comparator 24 in accordance with a sample pulse FDG supplied from the outside.

The D-FF circuit 462 is a D-type flip-flop circuit disposed between the D-FF circuit 461 and the control line 422, and an output terminal Q of the D-FF circuit 462 is connected to the control line 422. The D-FF circuit 462 reflects a setting according to the voltage signal VCO latched by the D-FF circuit 461 on the pixel 371. In other words, the D-FF circuit 462 latches the voltage signal VCO supplied from the D-FF circuit 461 in accordance with a sample pulse FDG' supplied from the outside and outputs the latched voltage signal to the control line 422 as a control signal Gain.

In addition, when an enforced setting signal LGFIX of the high level is supplied to the input terminal S of the D-FF circuit 462, a control signal Gain output from the D-FF circuit 462 is fixed to the high level, and, when an initialization signal INI of the high level is supplied to the input terminal R of the D-FF circuit 462, the control signal Gain output from the D-FF circuit 462 is initialized to the low level.

The up-down counter 463 is connected to the signal comparator 24 and the control line 422 and generates a pixel signal on the basis of the control signal Gain supplied from the control line 422 and the voltage signal VCO supplied from the signal comparator 24 and outputs the generated pixel signal.

<Description of Imaging Process>

Next, the operation of the solid-state imaging device 361 illustrated in FIG. 12 will be described.

When an imaging direction is made, the solid-state imaging device 361 performs an imaging process and outputs an acquired captured image. Hereinafter, the imaging process performed by the solid-state imaging device 361 will be described with reference to a timing diagram illustrated in FIG. 13.

Figure 13:
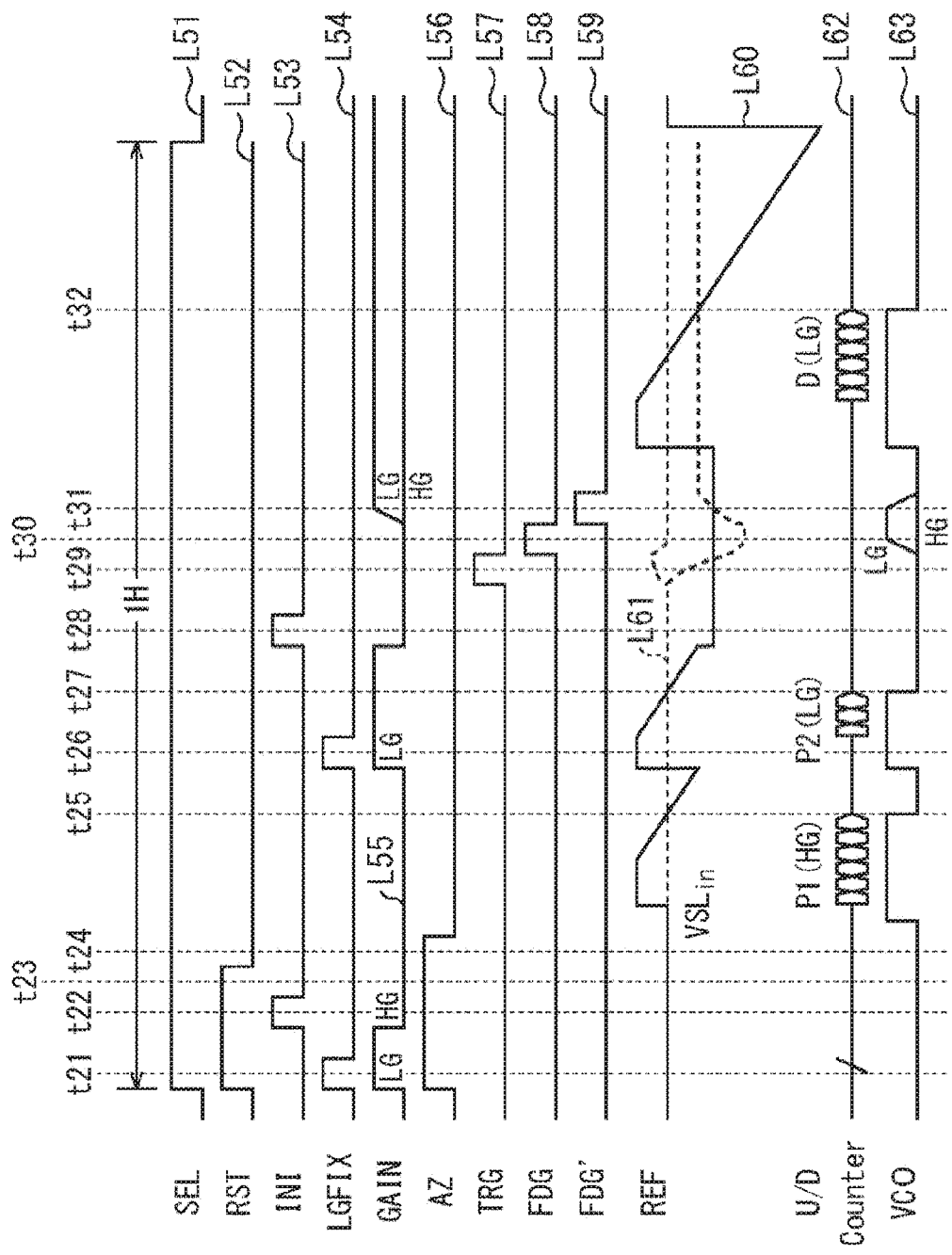
FIG. 13 is a timing diagram that illustrates an imaging process.

In addition, in FIG. 13, the horizontal direction represents the time, and the vertical direction represents the electric potential (voltage). Particularly, in the drawing, a state in which a signal or the like that upwardly protrudes represents a high-level state, and a state in which signal or the like that downwardly protrudes represents a low-level state.

In FIG. 13, polygonal lines L51 to L60 represent the waveforms of the control signal SEL, the drive signal RST, the initialization signal INI, the enforcing setting signal LGFIX, the control signal Gain, the drive signal AZ, the drive signal TRG, the sample pulse FDG, the sample pulse FDG', and the reference signal REF. In addition, a curve L61 of a dotted line represents the voltage (hereinafter, also referred to as a voltage $VSL_{in}$) of a signal supplied to the input terminal of the signal comparator 24 that is disposed on the capacitor 423 side. This voltage $VSL_{in}$ is acquired by reading the voltage of the electric charge/voltage converting unit 412 through a source follower circuit and cutting a DC component by using the capacitor 423.

In addition, polygonal lines L62 and L63 respectively represent the appearance of the count performed inside the up-down counter 463 and the voltage signal VCO.

First, at time t21, the control signal SEL is set to the high level, the pixel 371 is selected, and a state is formed in which the transistor 421 and the selection transistor 419 are turned on.

In addition, the enforcing setting signal LGFIX is set to the high level, the control signal Gain output from the D-FF circuit 462 is fixed to the high level, and a state in which the electric charge/voltage converting unit 412 and the capacitor 414 are electrically connected to each other, in other words, a low-gain state is formed. Simultaneously, the drive signal RST is set to the high level, and the electric charge/voltage converting unit 412 and the capacitor 414 are initialized to a predetermined voltage, and the drive signal AZ becomes the high level.

Thereafter, after the enforcing setting signal LGFIX is set to the low level, at time t22, the initialization signal INI is set to the high level, the control signal Gain output from the D-FF circuit 462 is fixed to the low level, and the electric charge/voltage converting unit 412 and the capacitor 414 are electrically disconnected from each other. In other words, a high-gain state is formed. Then, the initialization signal INI is returned to the low level.

At time t23, the drive signal RST is returned to the low level, the initialization of the capacitor 414 is released, and subsequently, at time t24, the drive signal AZ is returned to the low level from the high-level state. In this way, automatic zero is acquired by the signal comparator 24. In other words, the signal comparator 24 is initialized.

Subsequently, in the state in which the electric charge/voltage converting unit 412 is set to the high gain, a reset level is acquired.

In other words, the signal comparator 24 compares a voltage $VSL_{in}$ read from the electric charge/voltage converting unit 412 through the vertical signal line 420 with the slope supplied as the reference signal REF and supplies a voltage signal VCO acquired as a result thereof to the D-FF circuit 461 and the up-down counter 463.

When the acquisition of a reset level is started, the up-down counter 463 starts down counting of the time. Then, at time t25, when the voltage signal VCO is inverted from the high level to the low level, the up-down counter 463 ends the counting and stores a result of the count at the time point in an internal memory as the reset level. Accordingly, the digital value of a reset level of the high gain is acquired.

In addition, at time t26, the enforcing setting signal LGFIX is set to the high level, and the control signal Gain is fixed to the high level, and, after a low gain state in which the electric charge/voltage converting unit 412 and the capacitor 414 are electrically connected to each other is formed, the enforcing setting signal LGFIX is returned to the low level.

In such a low-gain state, similarly to the case at the time of acquiring a reset level of the high gain, a reset level of the low gain is acquired.

In other words, the signal comparator 24 compares the read voltage $VSL_{in}$ with the slope supplied as the reference signal REF and supplies the voltage signal VCO acquired as a result thereof to the D-FF circuit 461 and the up-down counter 463.

The up-down counter 463 starts down count of the time when the acquisition of a reset level is started, at time t27, ends the count when the voltage signal VCO is inverted from the high level to the low level, and stores a result of the count at the time point in an internal memory as a reset level. Accordingly, the digital value of a reset level of the low gain is acquired.

In addition, here, while the reset level of the low gain is acquired after the acquisition of the reset level of the high gain, after the acquisition of the reset level of the low gain, the reset level of the high gain may be acquired.

When the reset level is acquired, at time t28, the initialization signal INI is set to the high level, the control signal Gain is initialized to the low level, and the electric charge/voltage converting unit 412 and the capacitor 414 are electrically disconnected from each other. In other words, a high-gain state is formed. Then, the initialization signal INI is returned to the low level. At this time, the reference signal REF supplied to the signal comparator 24 is changed to the determination level for determining the conversion efficiency.

In this way, when the high-gain state is formed, at time t29, the drive signal TRG is set to the high level, the transfer transistor 411 is turned on, and the transfer of electric charge acquired by the photoelectric conversion unit 21 to the electric charge/voltage converting unit 412 is started.

Then, the signal comparator 24 compares the determination level supplied as the reference signal REF with the voltage $VSL_{in}$ and outputs a voltage signal VCO representing a result of the comparison. Simultaneously, the drive signal TRG is returned to the low level, and the exposure period of the pixel 371 ends, and a sample pulse FDG of the high level is input to the D-FF circuit 461 at time t30, and the voltage signal VCO supplied from the signal comparator 24 is read by the D-FF circuit 461.

Then, the sample pulse FDG is set to the low level, and, at time t31, a sample pulse FDG' of the high level is supplied to the D-FF circuit 462. In this way, the D-FF circuit 462 reads the voltage signal VCO output from the D-FF circuit 461 and directly outputs the voltage signal VCO to the control line 422 as a control signal Gain.

Then, when the signal amount acquired by the photoelectric conversion unit 21 is small, and the voltage signal VCO is in the low level, a control signal Gain of the low level is output, and the transistor 413 is maintained to be turned off. In other words, the capacitor 414 is maintained to be in the high-gain state of being separate from the electric charge/voltage converting unit 412.

In contrast to this, when the signal amount acquired by the photoelectric conversion unit 21 is large, and the voltage signal VCO is in the high level, a control signal Gain of the high level is output, the transistor 413 is turned on, and the capacitor 414 is connected to the electric charge/voltage converting unit 412. In other words, the low-gain state is formed.

In this way, in a case where the gain, in other words, the conversion efficiency of the electric charge/voltage converting unit 412 is adaptively changed at the time of reading a voltage signal (the voltage of the electric charge/voltage converting unit 412) corresponding to the electric charge acquired by the photoelectric conversion unit 21, the voltage $VSL_{in}$ supplied to the signal comparator 24 changes in accordance therewith.

In a case where the conversion efficiency is changed as is necessary, the sample pulse FDG' is set to the low level, and the reference signal REF is raised up to a predetermined level.

Subsequently, in a state in which the electric charge/voltage converting unit 412 is in the state of one of the high gain and the low gain in accordance with a result of the comparison performed by the signal comparator 24, a signal level is acquired. In this state, in the electric charge/voltage converting unit 412 or the electric charge/voltage converting unit 412 and the capacitor 414, the electric charge acquired by the photoelectric conversion unit 21 during the exposure period is accumulated.

The up-down counter 463, first, reads a reset level specified according to the control signal Gain supplied from the D-FF circuit 462 through the control line 422 from an internal memory and sets the read reset level in the counter.

In other words, when the control signal Gain is in the high level, a reset level of the low gain is read. On the other hand, when the control signal Gain is in the low level, a reset level of the high gain is read.

In addition, the signal comparator 24 compares the voltage $VSL_{in}$ read from the electric charge/voltage converting unit 412 through the vertical signal line 420 with the slope supplied as the reference signal REF and supplies a voltage signal VCO acquired as a result thereof to the D-FF circuit 461 and the up-down counter 463.

When the acquisition of a signal level is started, the up-down counter 463 stars up count of the time by using a counter to which the reset level is set. Then, at time t32, when the voltage signal VCO is inverted from the high level to the low level, the up-down counter 463 ends the count. In this way, simultaneously with the acquisition of a signal level, subtraction between the signal level and the reset level, in other words, calculation of the CDS or the DDS is performed, whereby the digital value of a pixel signal is acquired.

In this way, a result of the count acquired by the up-down counter 463 when the acquisition of a signal level is completed is the digital value of a pixel signal, and the up-down counter 463 outputs the acquired pixel signal to a later stage, and the imaging process ends.

As above, the solid-state imaging device 361 compares the reference signal REF with the voltage $VSL_{in}$ for each pixel 371 and adaptively changes the change efficiency of the pixel 371 in accordance with a result of the comparison at the time of acquisition of a signal level.

In this way, optimal conversion efficiency for each pixel 371 can be set in accordance with a high gain (low illuminance) or a low gain (high illuminance), and a high-quality captured image suppressing underexposure and overexposure can be acquired. In addition, by adaptively changing the conversion efficiency, the number of times of acquiring a signal level becomes only one, and a captured image can be more quickly acquired.

Note that, the configuration of the solid-state imaging device described above is merely an example, and the solid-state imaging device may have any configuration as long as the conversion efficiency can be adaptively changed by comparing the signal amount with the reference signal for each pixel of the solid-state imaging device.

For example, the configuration is not limited to the example in which the signal comparator is disposed within the pixel, but the signal comparator may be configured by a part of circuits disposed in the column processing unit outside the pixel and a part of circuits disposed within the pixel.

As such an example, for example, while a source follower circuit of a pixel of a general image sensor is configured by connecting an output line of the pixel to a current source disposed in a column processing unit using a selection line, a signal comparator having a configuration similar thereto may be also considered. In addition, since the roles of the source follower circuit and the signal comparator, in other words, operation timings thereof are different from each other, by changing the circuit configuration to be connected, the functions of both the source follower circuit and the signal comparator may be included.

<Example of Configuration of Imaging Apparatus>

In addition, the present technology can be applied to overall electronic apparatuses each using a solid-state imaging device in a photoelectric conversion unit such as an imaging apparatus such as a digital still camera or a video camera, a mobile terminal device having an imaging function, and a copying machine using a solid-state imaging device in an image reading unit. The solid-state imaging device may have a form that is formed as one chip or a form of a module device, in which an imaging unit and a signal processing unit or an optical system are packaged together, having an imaging function.

Figure 14:
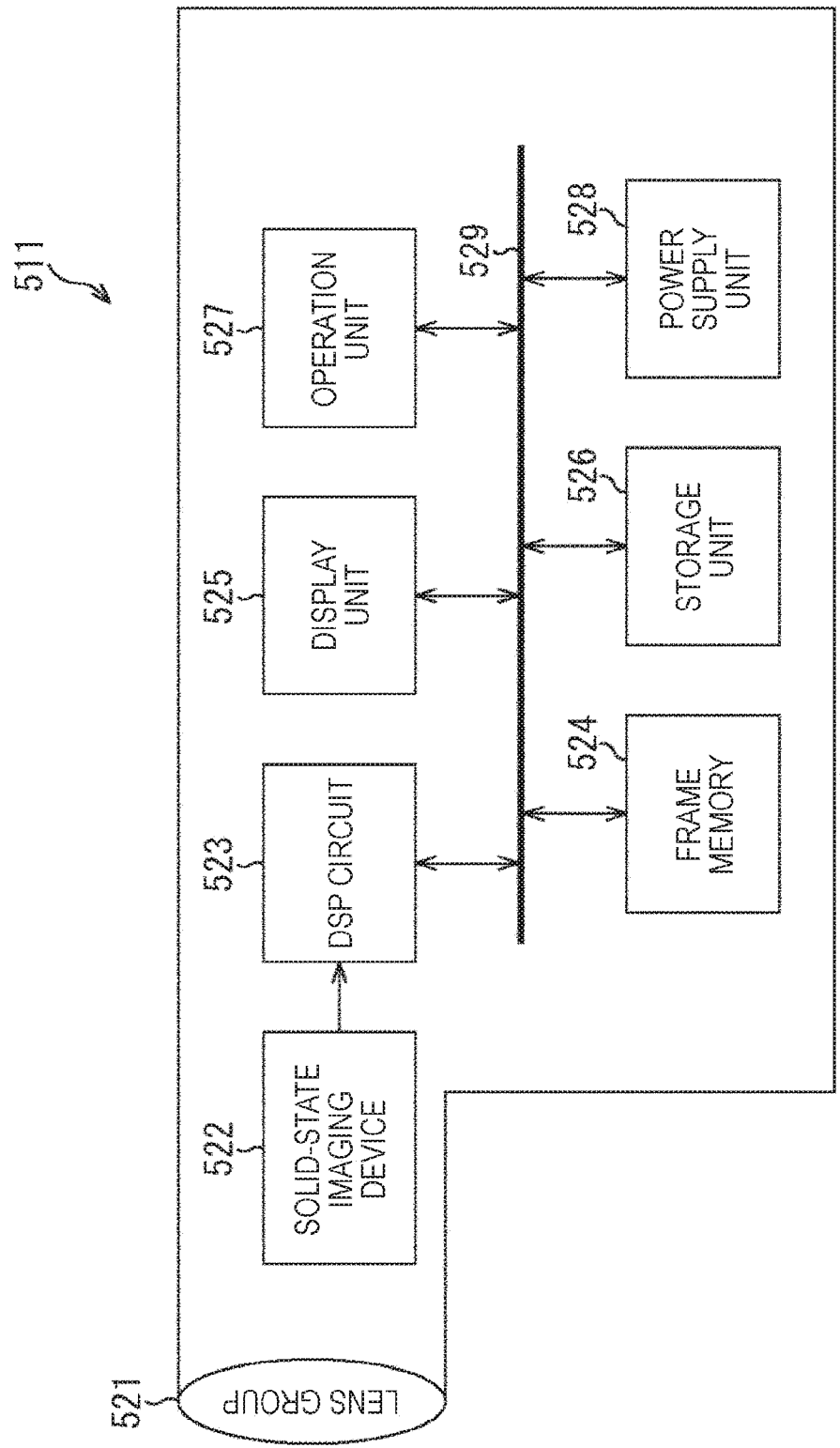
FIG. 14 is a diagram that illustrates an example of the configuration of an imaging apparatus.

FIG. 14 is a diagram that illustrates an example of the configuration of an imaging apparatus as an electronic apparatus according to the present technology.

The imaging apparatus 511 illustrated in FIG. 14 includes an optical unit 521 formed by a lens group and the like, a solid-state imaging device (imaging device) 522, and a digital signal processor (DSP) circuit 523 that is a camera signal processing circuit. In addition, the imaging apparatus 511 includes a frame memory 524, a display unit 525, a storage unit 526, an operation unit 527, and a power supply unit 528. The DSP circuit 523, the frame memory 524, the display unit 525, the storage unit 526, the operation unit 527, and the power supply unit 528 are interconnected through a bus line 529.

The optical unit 521 takes in incident light (image light) from a subject and forms an image on the imaging surface of the solid-state imaging device 522. The solid-state imaging device 522 converts the optical amount of the incident light formed as an image on the imaging surface by the optical unit 521 into an electric signal in units of pixels and outputs the electric signal as a pixel signal. This solid-state imaging device 522 corresponds to the solid-state imaging device 11 described above and the like.

The display unit 525, for example, is formed by a panel-type display device such as a liquid crystal panel or an organic electro luminescence (EL) panel and displays a moving image or a still image captured by the solid-state imaging device 522. The storage unit 526 stores a moving image or a still image captured by the solid-state imaging device 522 on a storage medium such as a video tape or a digital versatile disk (DVD).

The operation unit 527, under user's operation, issues an operation direction for various functions included in the imaging apparatus 511. The power supply unit 528 appropriately supplies various power sources that are operation power sources of the DSP circuit 523, the frame memory 524, the display unit 525, the storage unit 526, and the operation unit 527 to such supply targets.

In addition, in the embodiment described above, a case where the present technology is applied to a CMOS image sensor in which pixels each detecting signal electric charge corresponding to the optical amount of visible light as a physical quantity are arranged in a matrix pattern has been described as an example. However, the present technology is not limited to the application to the CMOS image sensor but can be applied to overall solid-state imaging devices.

An embodiment of the present technology is not limited to the embodiments described above, but various changes can be made in a range not departing from the concept of the present technology.

In addition, the present technology may employ the following configurations.

[1]
An imaging device including:
a photoelectric conversion unit that performs a photoelectric conversion of incident light;
an electric charge/voltage converting unit that converts apart or all of electric charge acquired by the photoelectric conversion into a voltage signal with predetermined conversion efficiency; and
a signal comparing unit that compares the voltage signal with a reference signal of a predetermined voltage,
wherein the conversion efficiency is changed in accordance with a result of the comparison performed by the signal comparing unit.

[2]
The imaging device according to [1],
wherein the imaging device includes a plurality of pixels, and
each of the pixels includes the photoelectric conversion unit and the electric charge/voltage converting unit.

[3]
The imaging device according to [1] or [2], further including a storage unit that stores a control signal determined on the basis of a result of the comparison and changes the conversion efficiency on the basis of the stored control signal.

[4]
The imaging device according to [3], further including a capacitor that accumulates electric charge overflowing in the photoelectric conversion unit,
wherein the storage unit changes the conversion efficiency by connecting the capacitor to the electric charge/voltage converting unit on the basis of the control signal.

[5]
The imaging device according to [3] or [4],
wherein the signal comparing unit, after exposure of the photoelectric conversion unit, in a state in which electric charge transferred from the photoelectric conversion unit is accumulated in the electric charge/voltage converting unit, compares the voltage signal with the reference signal, and
the storage unit, after the exposure, changes the conversion efficiency before the voltage signal corresponding to the electric charge accumulated in the electric charge/voltage converting unit is acquired as a signal level.

[6]
The imaging device according to [5], further including a taking-in unit that acquires a digital value of the signal level on the basis of the result of the comparison between the voltage signal and the reference signal of a slope shape,
wherein the signal comparing unit, after the conversion efficiency is changed, in a state in which the electric charge transferred from the photoelectric conversion unit is accumulated in the electric charge/voltage converting unit, compares the voltage signal with the reference signal of the slope shape.

[7]
The imaging device according to [6], wherein the taking-in unit acquires a digital value of the signal level by taking in a count signal supplied from the outside on the basis of the result of the comparison.

[8]
The imaging device according to [6] or [7],
wherein the signal comparing unit, in a reset state in which the electric charge/voltage converting unit is reset to a predetermined voltage, compares the voltage signal with the reference signal of the slope shape, and
the taking-in unit further acquires a digital value of a reset level on the basis of the result of the comparison in the reset state.

[9]
The imaging device according to [8],
wherein the taking-in unit outputs the digital value of the signal level and digital values of the reset levels acquired for a plurality of mutually-different conversion efficiencies, and the storage unit outputs a determination signal representing the conversion efficiency after the change that is determined according to the control signal.

[10]

The imaging device according to any one of [1] to [9], wherein the imaging device includes a plurality of pixels, and each of the pixels includes the photoelectric conversion unit, the electric charge/voltage converting unit, and the signal comparing unit.

[11]

The imaging device according to any one of [3] to [9], wherein the imaging device includes a plurality of pixels, and each of the pixels includes the photoelectric conversion unit, the electric charge/voltage converting unit, the signal comparing unit, and the storage unit.

[12]

The imaging device according to [3], wherein the imaging device includes a plurality of pixels, each of the pixels includes the photoelectric conversion unit, the electric charge/voltage converting unit, the signal comparing unit, and the storage unit, outputs an analog value of the voltage signal of a state in which electric charge transferred from the photoelectric conversion unit is accumulated in the electric charge/voltage converting unit, and outputs an analog value of the voltage signal of a reset state in which the electric charge/voltage converting unit is reset to a predetermined voltage acquired for each of a plurality of mutually-different conversion efficiencies, and the storage unit outputs a determination signal representing the conversion efficiency after the change that is determined according to the control signal.

[13]

The imaging device according to [12], further including an electric charge maintaining unit that is disposed between the photoelectric conversion unit and the electric charge/voltage converting unit and maintains electric charge transferred from the photoelectric conversion unit to the electric charge/voltage converting unit.

[14]

The imaging device according to [3], wherein the signal comparing unit compares the voltage signal with the reference signal immediately after transfer of electric charge from the photoelectric conversion unit to the electric charge/voltage converting unit, and the storage unit, after the transfer of the electric charge to the electric charge/voltage converting unit, changes the conversion efficiency before the voltage signal corresponding to electric charge accumulated in the electric charge/voltage converting unit is acquired as a signal level.

[15]

The imaging device according to [14], wherein the storage unit changes the conversion efficiency by connecting a capacitor to the electric charge/voltage converting unit on the basis of the control signal.

[16]

The imaging device according to any one of [3], [14] or [15], wherein the signal comparing unit and the storage unit are disposed outside a pixel of the imaging device.

[17]

The imaging device according to [16], further including a pixel signal calculating unit that calculates a pixel signal formed by a signal level and a reset level by, after the conversion efficiency is changed, acquiring the signal level on the basis of a result of a comparison acquired by comparing the voltage signal with the reference signal of a slope shape in a state in which electric charge transferred from the photoelectric conversion unit is accumulated in the electric charge/voltage converting unit and acquiring the reset level on the basis of a result of a comparison acquired by comparing the voltage signal with the reference signal of the slope shape in a reset state in which the electric charge/voltage converting unit is reset to a predetermined voltage.

[18]

The imaging device according to [17], wherein the pixel signal calculating unit calculates the pixel signal by using the signal level and the reset level specified according to the control signal among the reset levels acquired for a plurality of mutually-different conversion efficiencies.

[19]

A method of driving an imaging device including:

a photoelectric conversion unit that performs a photoelectric conversion of incident light;

an electric charge/voltage converting unit that converts apart or all of electric charge acquired by the photoelectric conversion into a voltage signal with predetermined conversion efficiency; and a signal comparing unit that compares the voltage signal with a reference signal of a predetermined voltage, the method including:

converting electric charge transferred from the photoelectric conversion unit into the voltage signal by using the electric charge/voltage converting unit;

comparing the voltage signal with the reference signal by using the signal comparing unit; and changing the conversion efficiency in accordance with a result of the comparison using the signal comparing unit.

[20]

An electronic apparatus including:

a photoelectric conversion unit that performs a photoelectric conversion of incident light;

an electric charge/voltage converting unit that converts apart or all of electric charge acquired by the photoelectric conversion into a voltage signal with predetermined conversion efficiency; and a signal comparing unit that compares the voltage signal with a reference signal of a predetermined voltage, wherein the conversion efficiency is changed in accordance with a result of the comparison performed by the signal comparing unit.

REFERENCE SIGNS LIST

11 Solid-state imaging device
21 Photoelectric conversion unit
22 Transmission unit
23 Electric charge/voltage converting unit
24 Signal comparator
25 Storage unit
161 Light receiving unit
162 Signal comparator
163 Storage unit
164 Storage unit

The invention claimed is:

1. An imaging device, comprising:
a photoelectric conversion circuit configured to execute a photoelectric conversion of incident light;
an electric charge/voltage converting circuit configured to convert one of a part or all of electric charge acquired by the photoelectric conversion into a voltage signal with a first conversion efficiency;

a capacitor configured to accumulate the electric charge that overflows from the photoelectric conversion circuit;

a signal comparator configured to compare the voltage signal with a reference signal of a first voltage; and a storage circuit configured to:
store a control signal determined based on a result of the comparison of the voltage signal with the reference signal of the first voltage;
connect the capacitor to the electric charge/voltage converting circuit based on the control signal; and
change the first conversion efficiency based on:
the stored control signal, and
the connection of the capacitor to the electric charge/voltage converting circuit.

2. The imaging device according to claim 1, further comprising
a plurality of pixels,
wherein each pixel of the plurality of pixels includes the photoelectric conversion circuit and the electric charge/voltage converting circuit.

3. The imaging device according to claim 1, wherein
the signal comparator is further configured to compare the voltage signal with the reference signal after exposure of the photoelectric conversion circuit and in a state in which the electric charge transferred from the photoelectric conversion circuit is accumulated in the electric charge/voltage converting circuit, and
the storage circuit is further configured to change the first conversion efficiency after the exposure and before the voltage signal corresponding to the electric charge accumulated in the electric charge/voltage converting circuit is acquired as a signal level.

4. The imaging device according to claim 3, further comprising
a taking-in circuit configured to acquire a first digital value of the signal level based on a result of the comparison between the voltage signal and a reference signal of a slope shape,
wherein the signal comparator is further configured to compare the voltage signal with the reference signal of the slope shape after the first conversion efficiency is changed and in the state in which the electric charge transferred from the photoelectric conversion circuit is accumulated in the electric charge/voltage converting circuit.

5. The imaging device according to claim 4, wherein
the taking-in circuit is further configured to acquire the first digital value of the signal level based on a count signal supplied from the outside.

6. The imaging device according to claim 4, wherein
the signal comparator is further configured to compare the voltage signal with the reference signal of the slope shape in a reset state in which the electric charge/voltage converting circuit is reset to a second voltage, and
the taking-in circuit is further configured to acquire a second digital value of a reset level based on a result of the comparison of the voltage signal with the reference signal of the slope shape in the reset state.

7. The imaging device according to claim 6, wherein
the taking-in circuit is further configured to output the first digital value of the signal level and digital values of reset levels acquired for a plurality of mutually-different conversion efficiencies, the storage circuit is further configured to output a determination signal representing a second conversion efficiency after the change, and
the second conversion efficiency is determined based on the control signal.

8. The imaging device according to claim 1, further comprising
a plurality of pixels,
wherein each pixel of the plurality of pixels includes the photoelectric conversion circuit, the electric charge/voltage converting circuit, and the signal comparator.

9. The imaging device according to claim 1, further comprising
a plurality of pixels,
wherein each pixel of the plurality of pixels includes the photoelectric conversion circuit, the electric charge/voltage converting circuit, the signal comparator, and the storage circuit.

10. The imaging device according to claim 1, further comprising
a plurality of pixels, wherein
each pixel of the plurality of pixels includes the photoelectric conversion circuit, the electric charge/voltage converting circuit, the signal comparator, and the storage circuit,
each pixel of the plurality of pixels is configured to:
output a first analog value of the voltage signal of a state in which the electric charge transferred from the photoelectric conversion circuit is accumulated in the electric charge/voltage converting circuit; and
output a second analog value of the voltage signal of a reset state in which the electric charge/voltage converting circuit is reset to a second voltage acquired for each conversion efficiency of a plurality of mutually-different conversion efficiencies, and
the storage circuit is further configured to output a determination signal representing a second conversion efficiency after the first conversion efficiency is changed,
wherein the second conversion efficiency is determined based on the control signal.

11. The imaging device according to claim 10, further comprising
an electric charge maintaining circuit between the photoelectric conversion circuit and the electric charge/voltage converting circuit,
wherein the electric charge maintaining circuit is configured to maintain the electric charge transferred from the photoelectric conversion circuit to the electric charge/voltage converting circuit.

12. The imaging device according to claim 1, wherein
the signal comparator is further configured to compare the voltage signal with the reference signal immediately after transfer of the electric charge from the photoelectric conversion circuit to the electric charge/voltage converting circuit, and
the storage circuit is further configured to change the first conversion efficiency after the transfer of the electric charge to the electric charge/voltage converting circuit and before the voltage signal corresponding to the electric charge accumulated in the electric charge/voltage converting circuit is acquired as a signal level.

13. The imaging device according to claim 1, wherein the signal comparator and the storage circuit are outside of a pixel of the imaging device.

14. The imaging device according to claim 13, further comprising a pixel signal calculating circuit configured to:
acquire a signal level based on a result of a comparison of the voltage signal with a reference signal of a slope shape in a state in which the electric charge transferred from the photoelectric conversion circuit is accumulated in the electric charge/voltage converting circuit; and
acquire a reset level based on a result of a comparison of the voltage signal with the reference signal of the slope shape in a reset state in which the electric charge/voltage converting circuit is reset to a second voltage.

15. The imaging device according to claim 14, wherein the pixel signal calculating circuit is further configured to calculate a pixel signal based on the signal level and the reset level, and
the signal level and the reset level are specified, based on the control signal, among reset levels acquired for a plurality of mutually-different conversion efficiencies.

16. A method of driving an imaging device, the method comprising:
executing, by a photoelectric conversion circuit, a photoelectric conversion of incident light;
converting, by an electric charge/voltage converting circuit, one of a part or all of electric charge transferred from the photoelectric conversion circuit into a voltage signal, wherein
the electric charge is converted with a specific conversion efficiency;
accumulating, by a capacitor, the electric charge that overflows from the photoelectric conversion circuit;
comparing, by a signal comparator, the voltage signal with a reference signal of a specific voltage;
storing, by a storage circuit, a control signal determined based on a result of the comparison of the voltage signal with the reference signal of the specific voltage;
connecting, by the storage circuit, the capacitor to the electric charge/voltage converting circuit based on the control signal; and
changing, by the storage circuit, the specific conversion efficiency based on:
the stored control signal, and
the connection of the capacitor to the electric charge/voltage converting circuit.

17. An electronic apparatus, comprising:
a photoelectric conversion circuit configured to execute a photoelectric conversion of incident light;
an electric charge/voltage converting circuit configured to convert one of a part or all of electric charge acquired by the photoelectric conversion into a voltage signal with a specific conversion efficiency;
a capacitor configured to accumulate the electric charge that overflows from the photoelectric conversion circuit;
a signal comparator configured to compare the voltage signal with a reference signal of a specific voltage;
a storage circuit configured to:
store a control signal determined based on a result of the comparison of the voltage signal with the reference signal of the specific voltage;
connect the capacitor to the electric charge/voltage converting circuit based on the control signal; and
change the specific conversion efficiency based on:
the stored control signal, and
the connection of the capacitor to the electric charge/voltage converting circuit.

* * * * *